(12) United States Patent
Zhao et al.

(10) Patent No.: US 6,550,032 B1
(45) Date of Patent: Apr. 15, 2003

(54) DETECTING INTERPORT FAULTS IN MULTIPORT STATIC MEMORIES

(75) Inventors: Jun Zhao, Whitehall, PA (US); Mukesh Puri, Fremont, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/363,697

(22) Filed: Jul. 28, 1999

(51) Int. Cl.$^7$ .............................................. G01R 31/28
(52) U.S. Cl. ...................................... 714/730
(58) Field of Search ................................ 714/718, 733, 714/743, 738, 730; 711/131, 117; 365/201, 230.05, 154, 189.04; 710/56, 33–48, 52; 713/1

(56) References Cited

U.S. PATENT DOCUMENTS

| | | | | |
|---|---|---|---|---|
| 5,742,557 A | * | 4/1998 | Gibbins et al. | 365/230.05 |
| 5,761,110 A | | 6/1998 | Irrinki et al. | 365/100 |
| 5,784,328 A | | 7/1998 | Irrinki et al. | 365/228 |
| 5,808,932 A | | 9/1998 | Irrinki et al. | 365/150 |
| 5,822,228 A | | 10/1998 | Irrinki et al. | 364/580 |
| 5,847,990 A | | 12/1998 | Irrinki et al. | 365/154 |
| 5,867,423 A | | 2/1999 | Kapoor et al. | 365/168 |
| 6,070,256 A | * | 5/2000 | Wu et al. | 714/718 |
| 6,085,290 A | * | 7/2000 | Smith et al. | 711/131 |

OTHER PUBLICATIONS

NN9208320 (Profiling Technique for Memory References within Individual Pages on Paging Based Virtual Memory Systems; IBM Tech. Disclosure Bulletin, vol. # 35; Issue # 3; pp. 320–325; Aug. 1, 1992.*

*Design And Algorithms For Parallel Testing Of Random Access And Content Addressable Memories*, P. Mazumder et al., 24$^{th}$ ACM/IEEE Design Automation Conference© 1987, Paper 36.2, pp. 688–694.
*Built–In Self–Test For Multi–Port RAMs*, Yuejian Wu et al., 6 pages.
*A 5Gb/s 9–Port Application Specific SRAM With Built–In Self–Test*, Steven W. Wood et al., pp. 68–73.
*Dual Port Static RAM Testing*, Manuel J. Raposa, 1988 International Test Conference, © 1988 IEEE, Paper 20.3, pp. 362–368.
*Associative Processors And Memories: A Survey*, Karl E. Grosspletsch, IEEE Micro, Jun. 1992, IEEE Publication No. 0272–1732/92/0600–0012, pp. 12–19.
*Using March Tests To Test SRAMs*, Ad J. Van De Goor, IEEE Design & Test Of Computers, IEEE Publication No. 0740–7475/93/0300–0008, pp. 8–14.

(List continued on next page.)

Primary Examiner—Albert Decady
Assistant Examiner—Guy Lamarre
(74) Attorney, Agent, or Firm—Conley, Rose & Tayon

(57) ABSTRACT

A multiport testing procedure capable of detecting faults that occur between static random access memory ports as well as traditional cells faults uncovers all possible faults and covers all cells in the memory, without placing architectural constraints on the memory. While executing a test sequence on one port of the memory array, concurrent memory accesses are performed through other ports in the memory. If a fault exists between the port under test and any other port, then the concurrent operations interfere with the values read and/or written on the port under test, and the test uncovers the fault. Thus, for any one test port, the interport test requires only as many memory operations as the associated single port test, keeping test time to a minimum. One embodiment detects faults between the test port, which is a read/write port, and any other port, including read ports and write ports, comprising six passes through the memory. Another embodiment detects faults between write ports, comprising four memory passes. An embodiment of a memory test circuit is disclosed that executes the multiport tests.

41 Claims, 16 Drawing Sheets

OTHER PUBLICATIONS

*Modem/Radio IC Architectures For ISM Band Wireless Applications*, Yanpen Guo et al., IEEE Transactions On Consumer Electronics, vol. 39, No. 2, May 1993, IEEE Publication No. 0098 3063/93, pp. 100–106.

*A High Speed Embedded Cache Design With Non–Intrusive BIST*, Steve Kornachuk et al., 0–8186–62345–X/94, pp. 40–45.

*On Fault Modeling And Testing Of Content–Addressable Memories*, W. K. Al–Assadi et al., IEEE Publication No. 0–8186–6245–X/94, pp. 78–83.

*Fault Models And Tests For Ring Address Type FIFO*, Ad J. van de Goor et al., IEEE Publication No. 0–8186–5440–6/94, pp. 300–305.

*Testing Complex Couplings In Multiport Memories*, M. Nicolaidis et al., IEEE Transactions On Very Large Scale Integration (VLSI) Systems, vol. 3, No. 1, Mar. 1995, IEEE Publication No. 1063–8210/95, pp. 59–71.

*An Efficient Test Method For Embedded Multi–port RAM with BIST Circuitry*, T. Matsumura, IEEE Publication No. 0–8186–7102–5/95, pp. 62–67.

*Yield And Cost Estimation For A CAM–Based Parallel Processor*, W. B. Noghani et al., IEEE Publication No. 0–8186–7102–5/95, pp. 110–116.

*Functional Test For Shifting–Type FIFOs*, Ad J. van de Goor et al., IEEE Publication No. 1066–1409/95, pp. 133–138.

*March LR: A Test For Realistic Linked Faults*, A. J. van de Goor et al., 14$^{th}$ VLSI Test Symposium—1996, IEEE Publication No. 0–8186–7304–4/96, pp. 272–280.

*March U: A Test For Unlinked Memory Faults*, A. J. van de Goor et al., © IEE, 1997, IEE Proceedings online No. 19971147, 6 pages.

*Disturb Neighborhood Pattern Sensitive Fault*, A. J. van de Goor et al., IEEE Publication No. 0–8186–7810–0/97, pp. 37–45.

*An Analysis Of (Linked) Address Decoder Faults*, A. J. van de Goor et al., IEEE Publication No. 0–8186–8099–7/97, pp. 13–20.

*An Open Notation For Memory Tests*, Aad Offerman et al., IEEE Publication No. 0–8186–8099–7/97, pp. 71–78.

*False Write Through And Un–Restored Write Electrical Level Fault Models For SRAMs*, R. Dean Adams et al., IEEE Publication No. 0–8186–8099–7/97, pp. 27–32.

*Use Of Selective Precharge For Low–Power On The Match Lines Of Content–Addressable Memories*, Charles A. Zukowski et al., IEEE Publication No. 0–8186–8099–7/97, pp. 64–68.

*An Approach To Modeling And Testing Memories And Its Application To CAMs*, Piotr R. Sidorowicz et al., IEEE Publication No. 0–8186–8436–4/98, pp. 411–416.

*Fault Models And Tests For Two–Port Memories*, A. J. van de Goor et al., IEEE Publication No. 0–8186–8436–4/98, pp. 401–410.

Raposa (Dual Port Static RAM testing; IEEE; 1988; pp. 362–368).*

Wu et al. (Built–in self–test for multi–port RAMs; IEEE; Nov. 1997, pp. 398–403).*

Zhao et al. (Detection of inter–port faults in multi–port static RAMs; IEEE; May 2000, pp. 297–302).*

Zhao et al. (Testing SRAM–Based Content Addressable Memories; IEEE; Oct. 2000, pp. 297–302).*

* cited by examiner

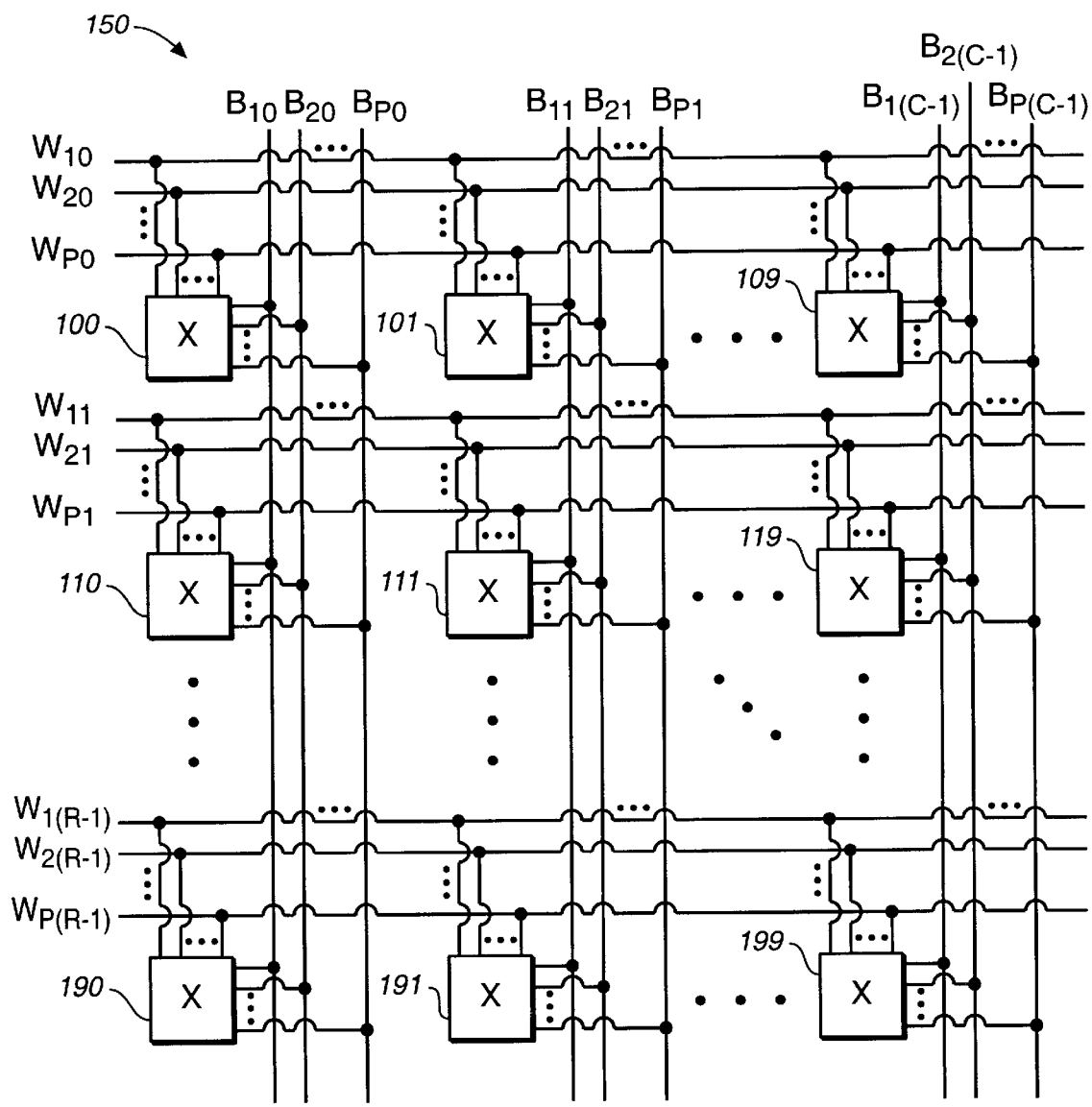
FIG._1
*(PRIOR ART)*

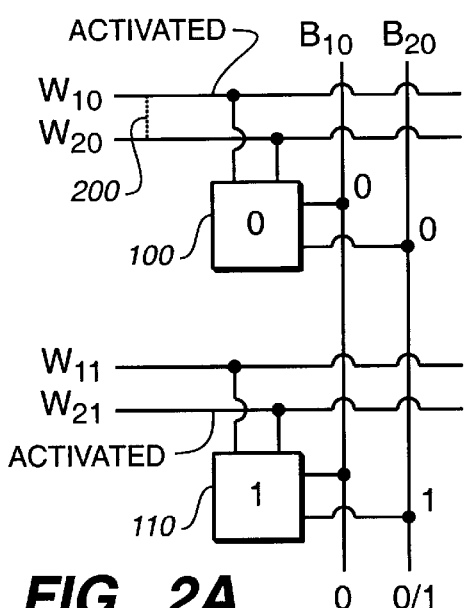
FIG._2A
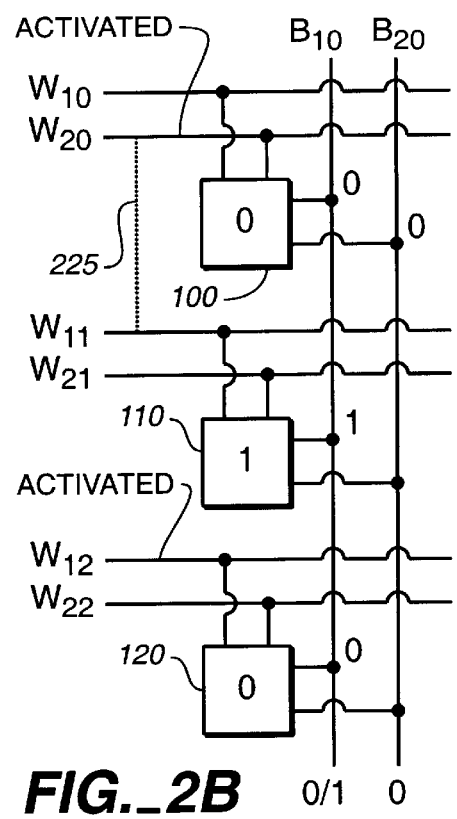
FIG._2B

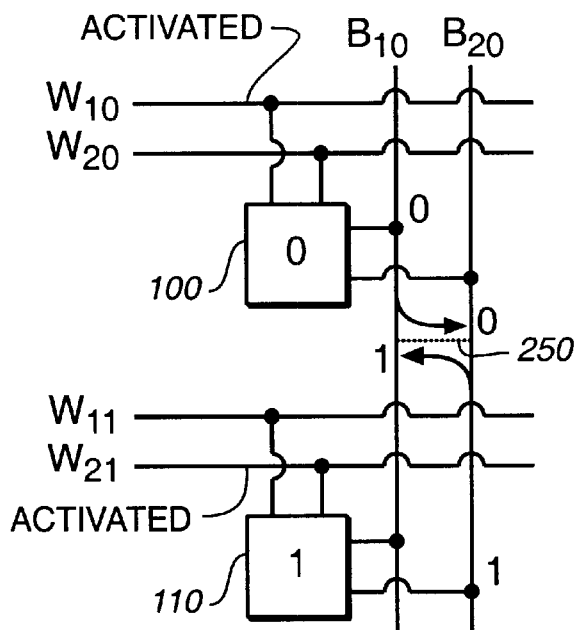
FIG._2C
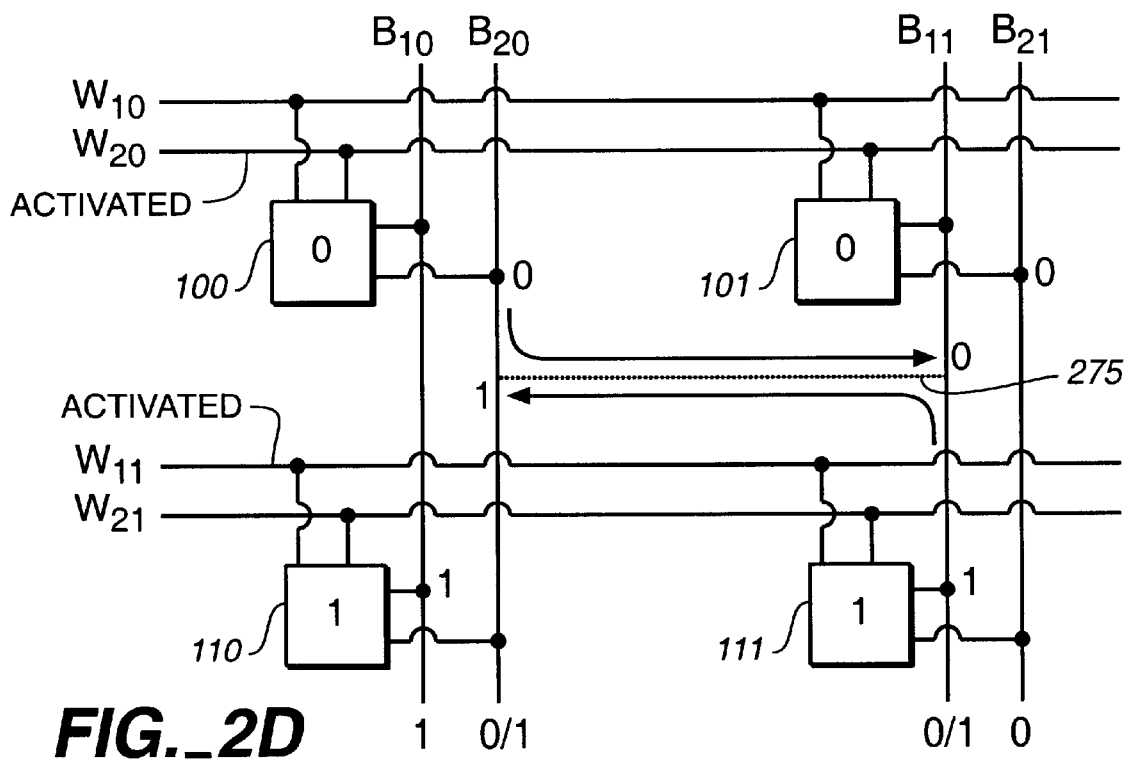
FIG._2D

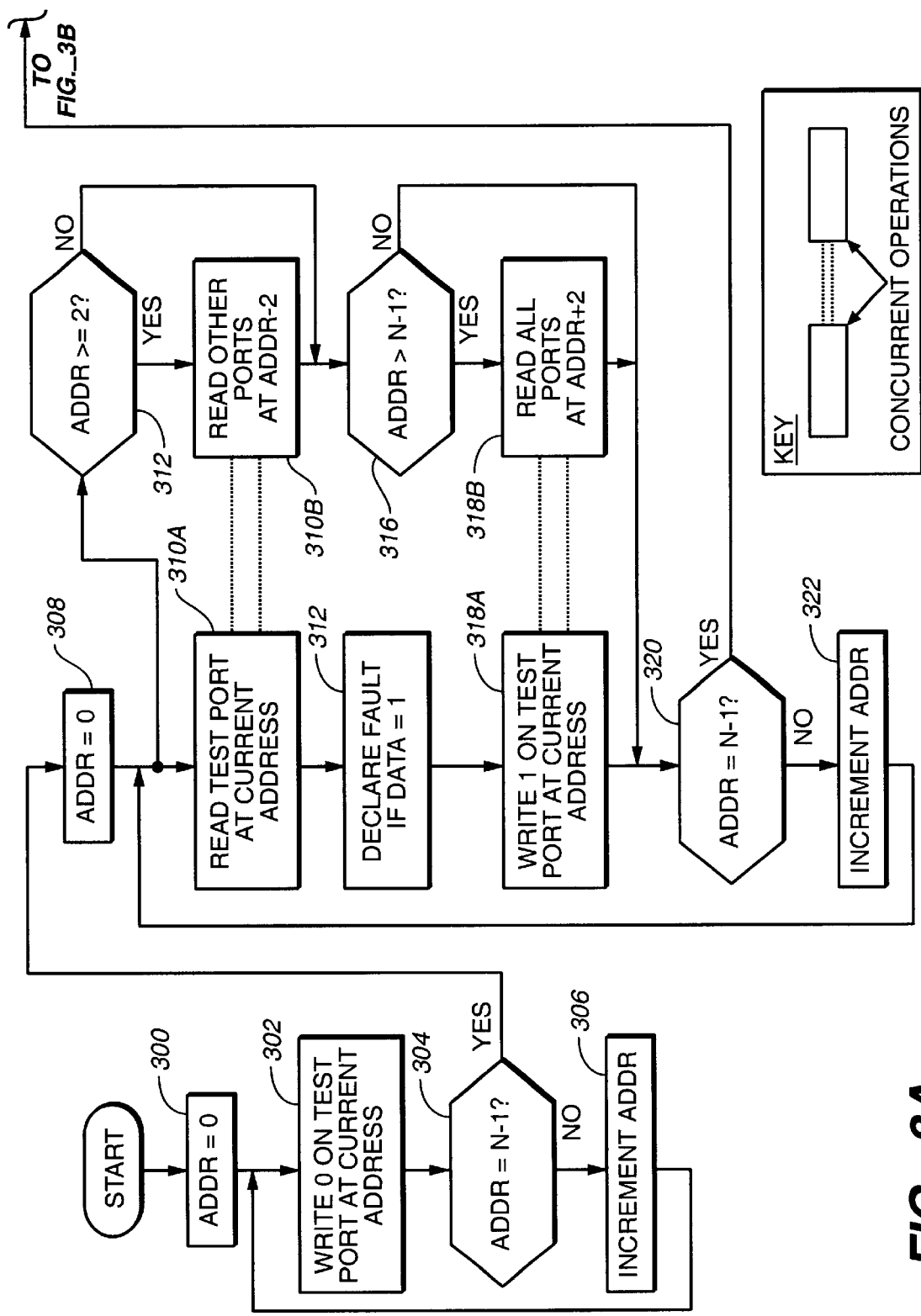
FIG._3A

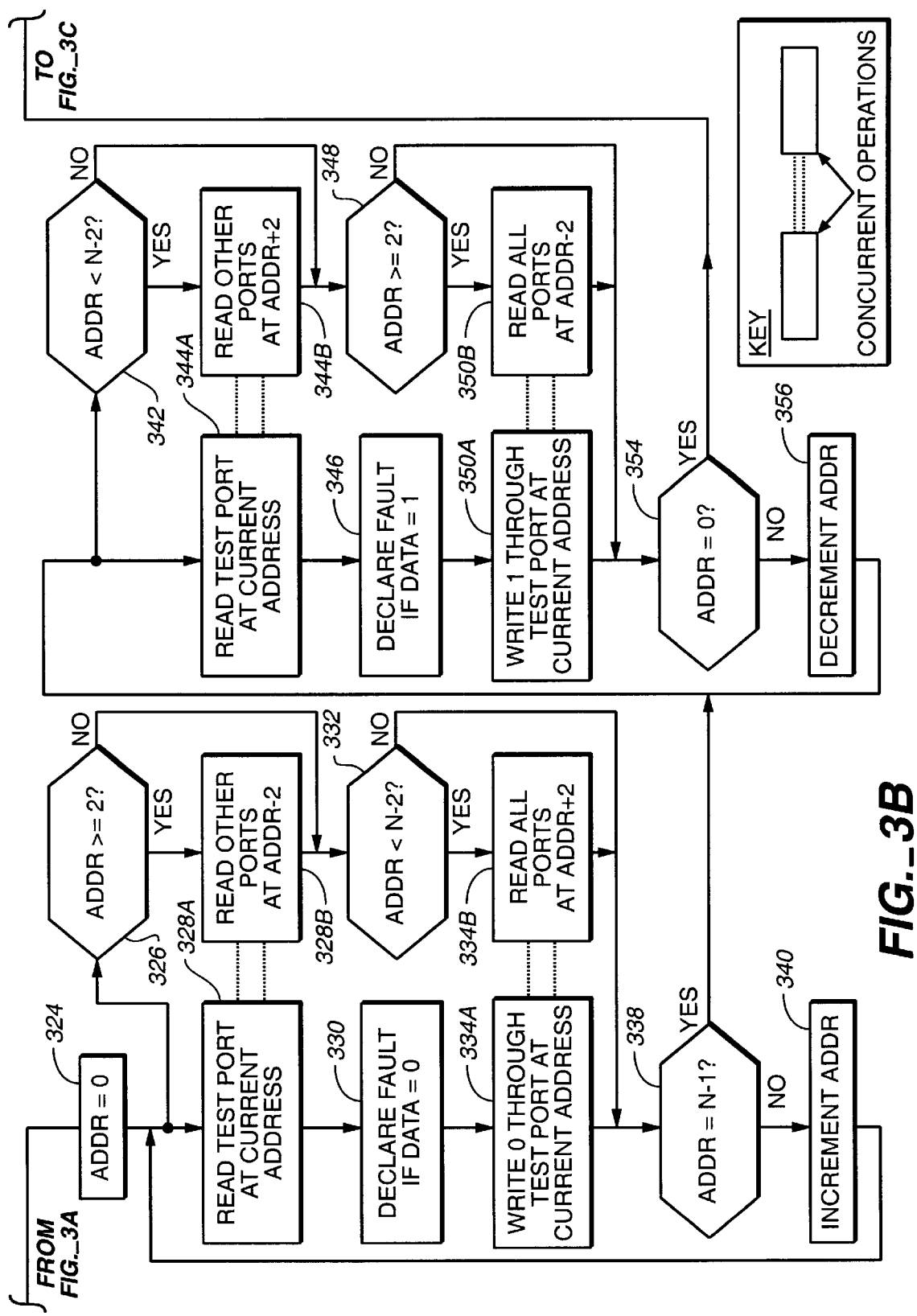
FIG._3B

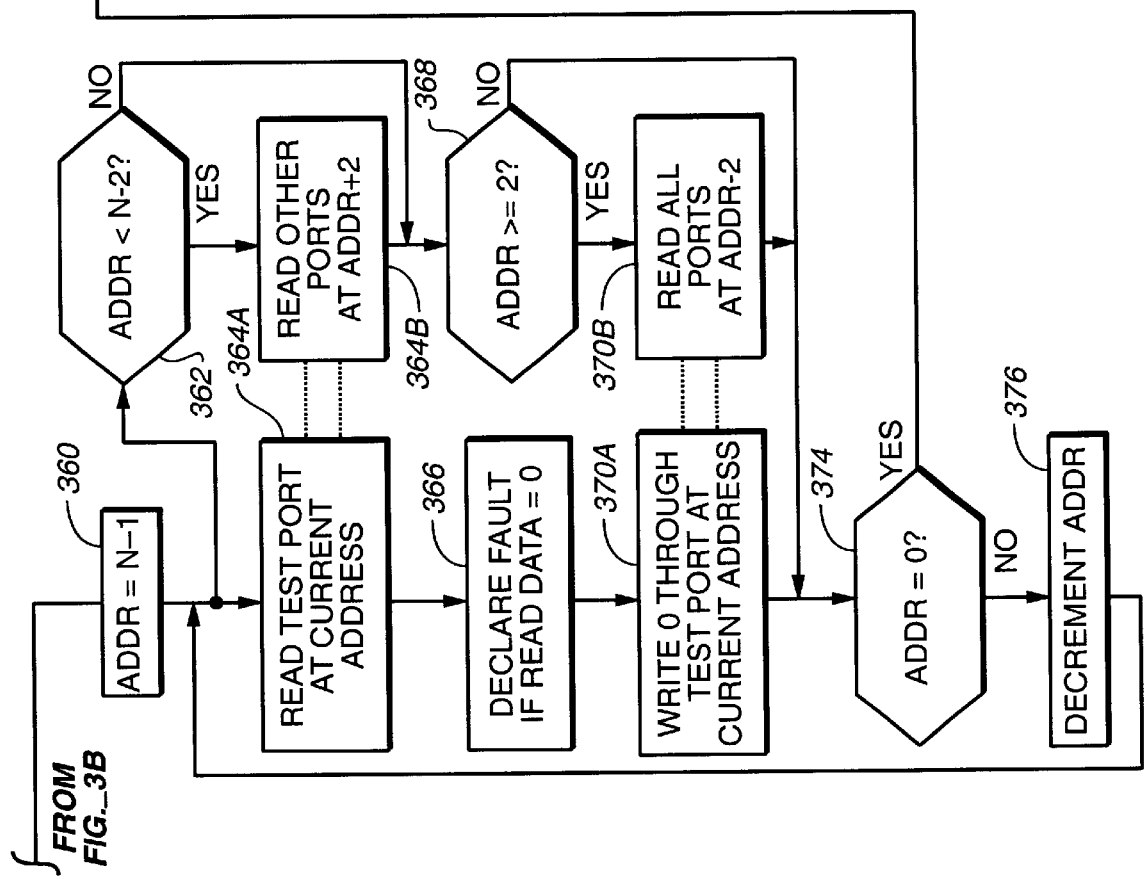

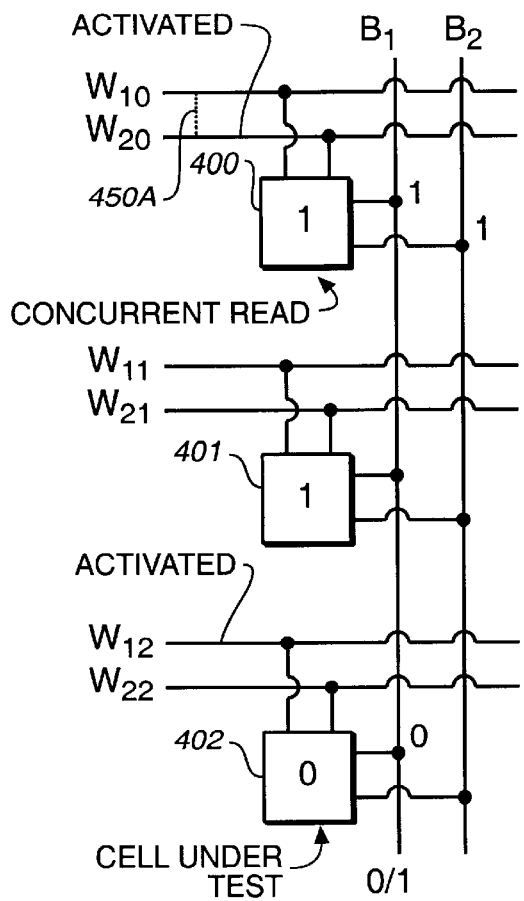
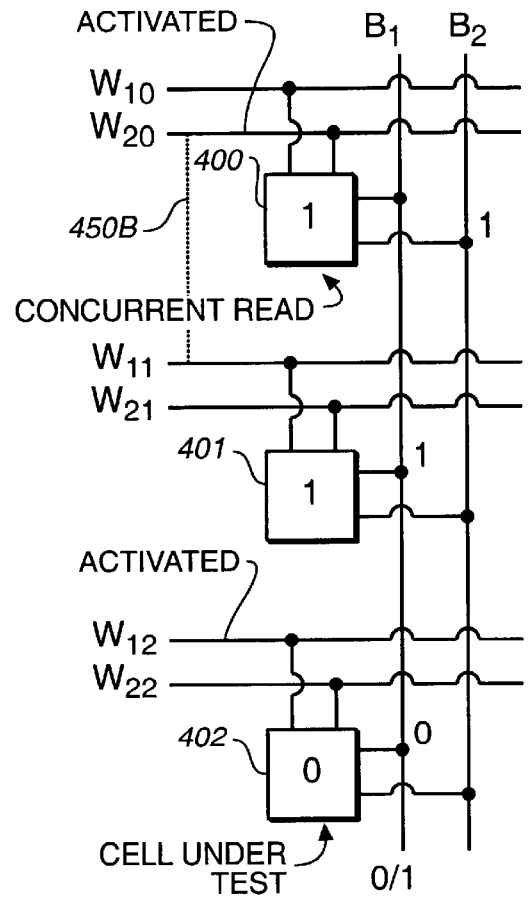
FIG._4A  FIG._4B

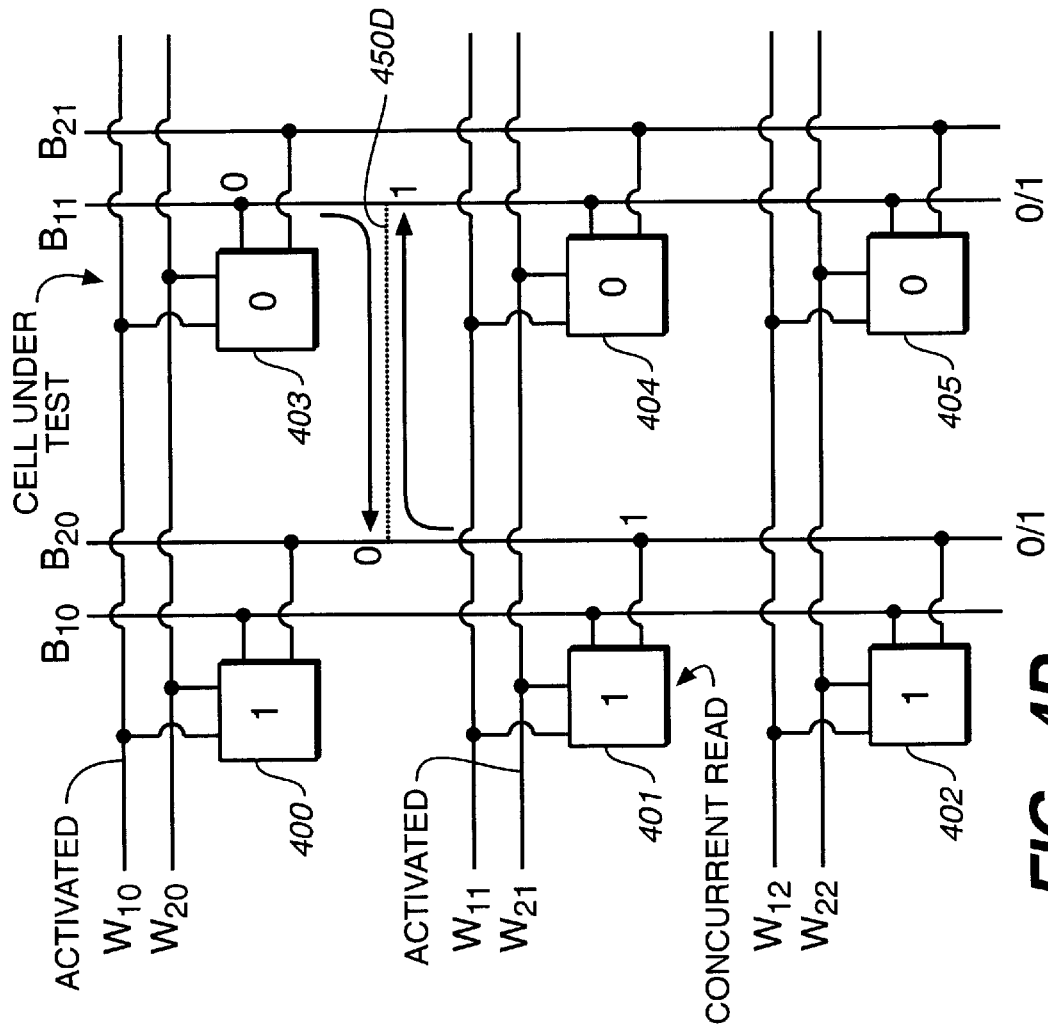
FIG._4D
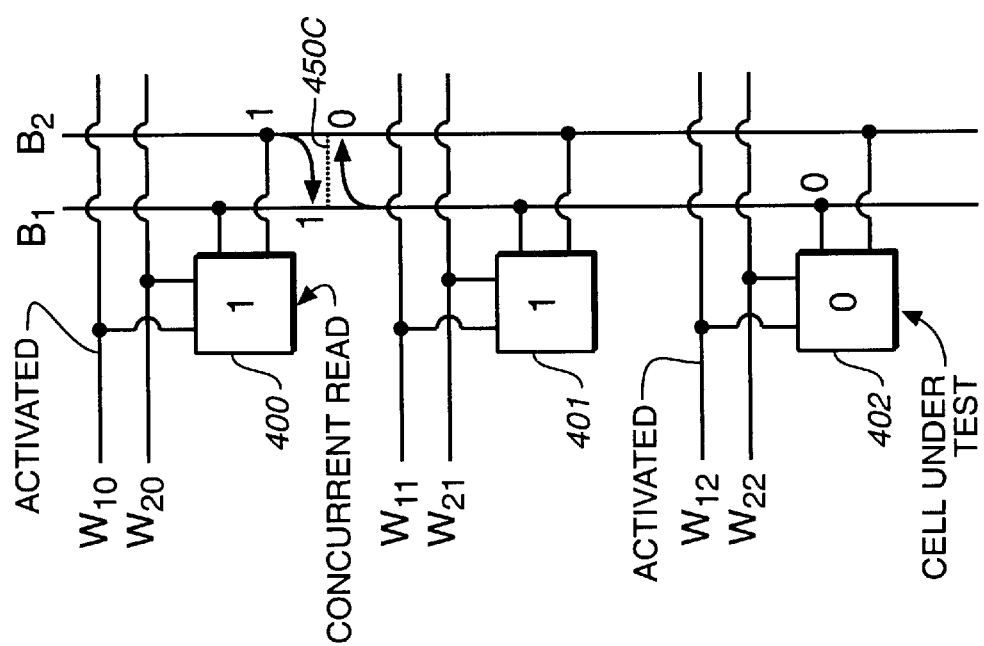
FIG._4C

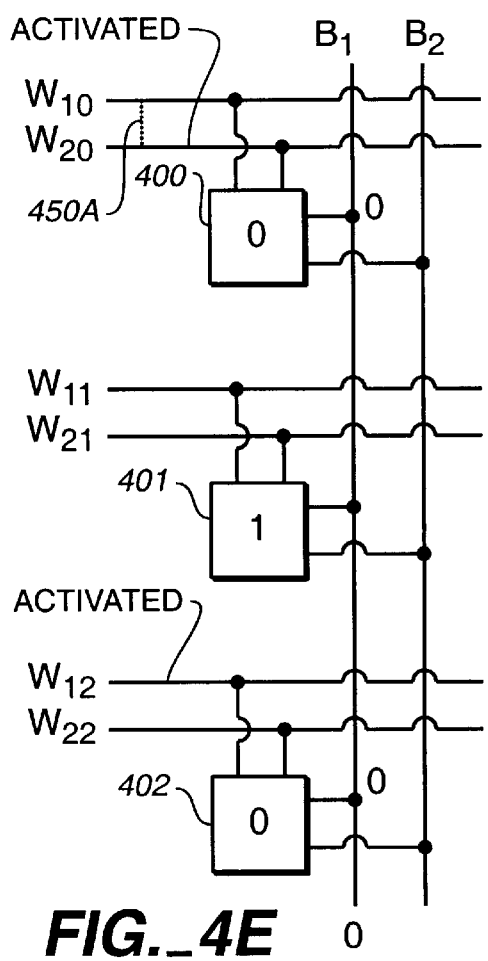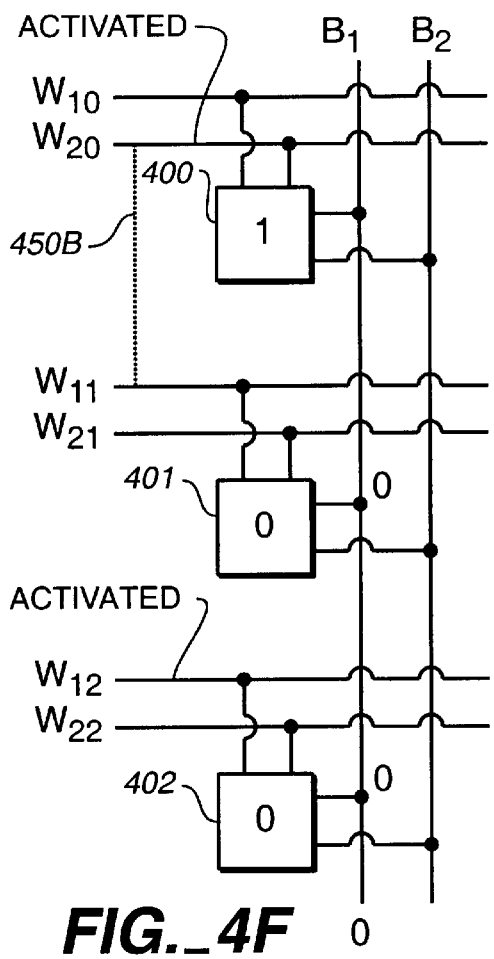
FIG._4E
FIG._4F

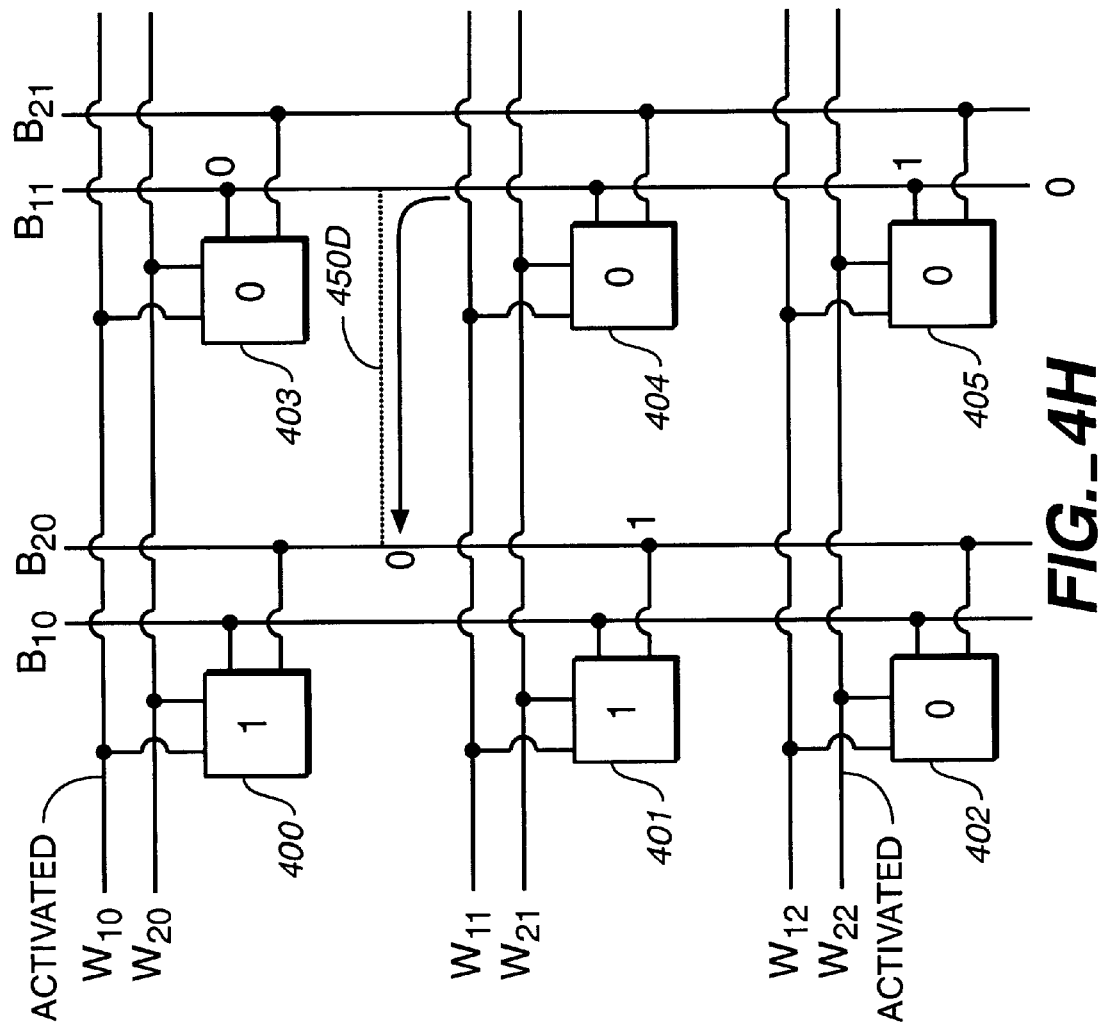
FIG._4H
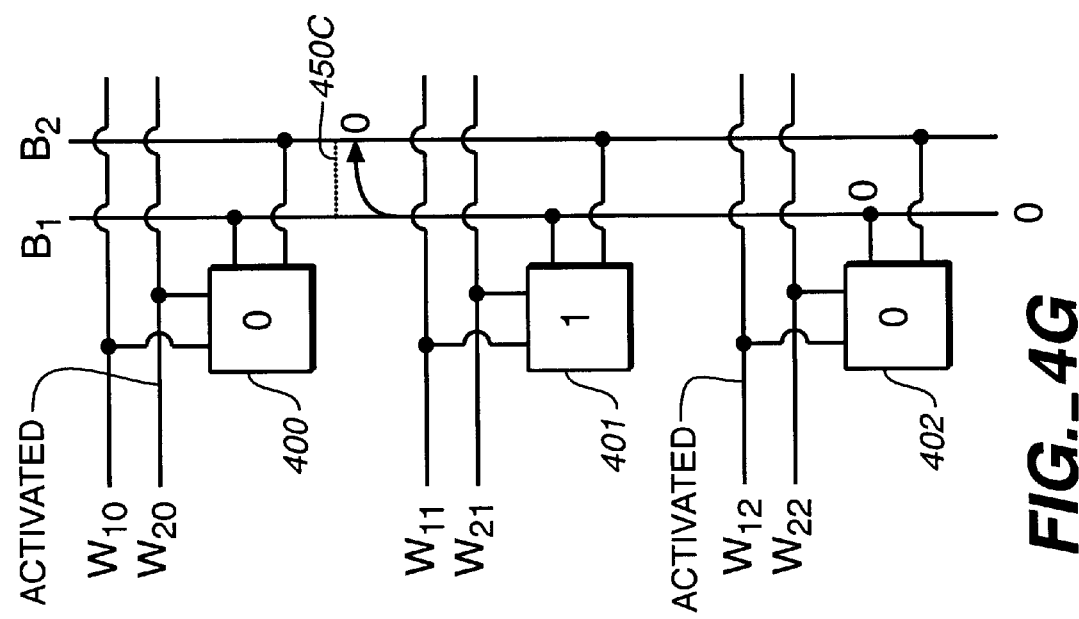
FIG._4G

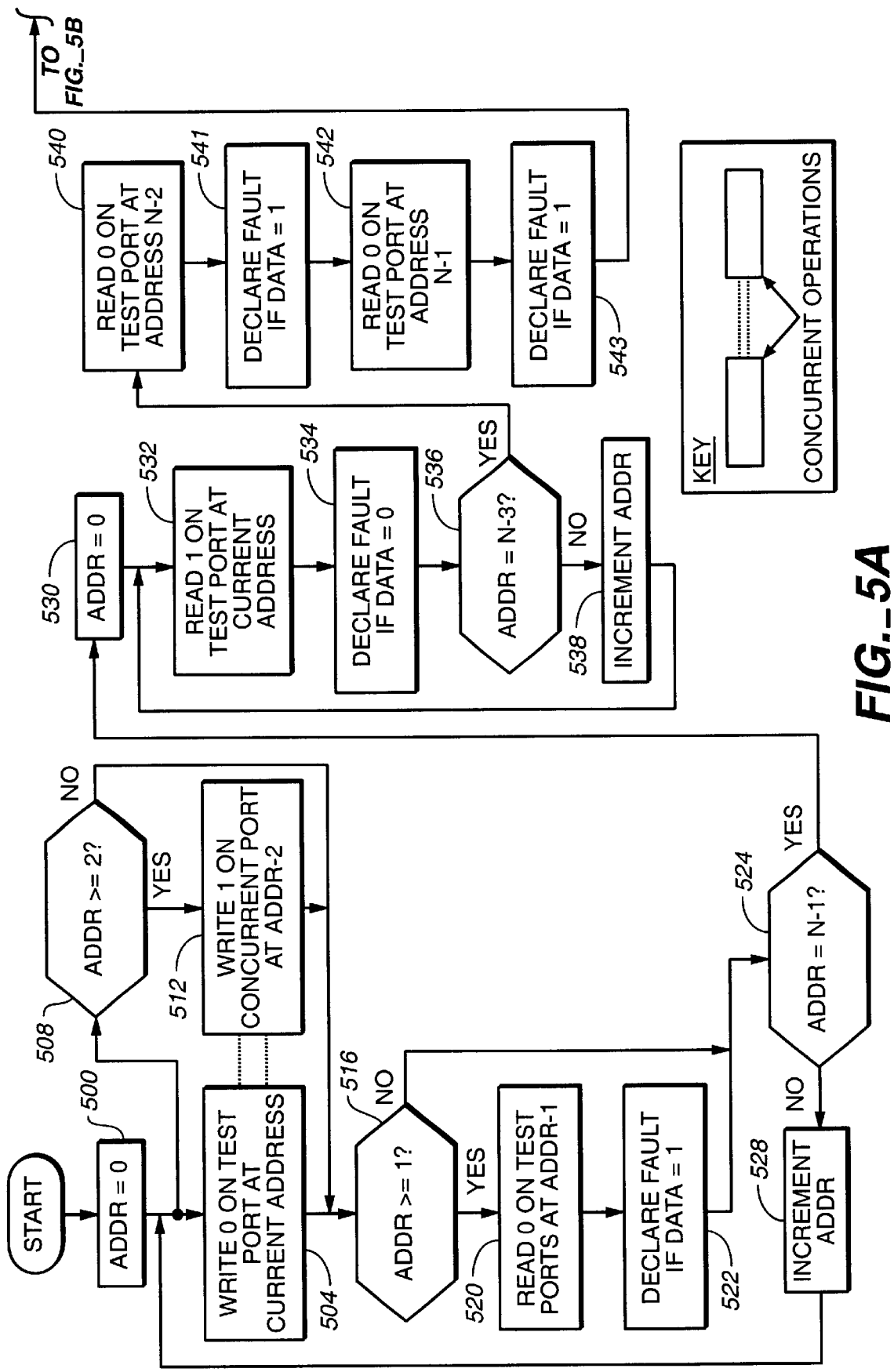
FIG._5A

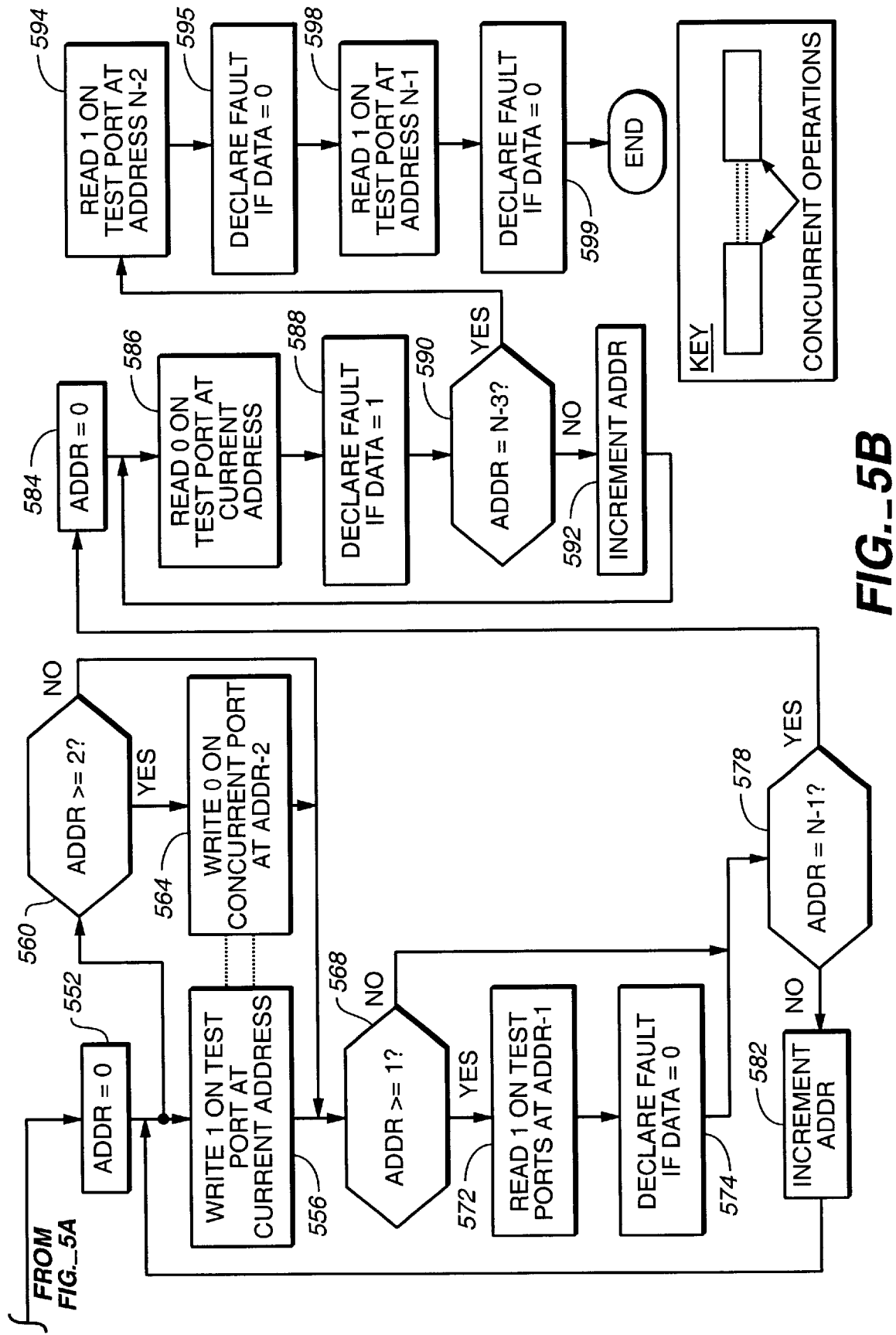
FIG._5B

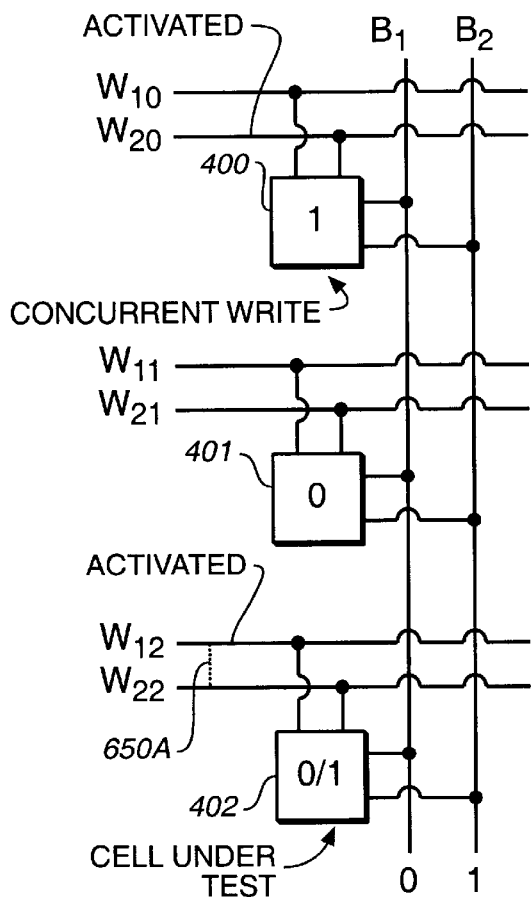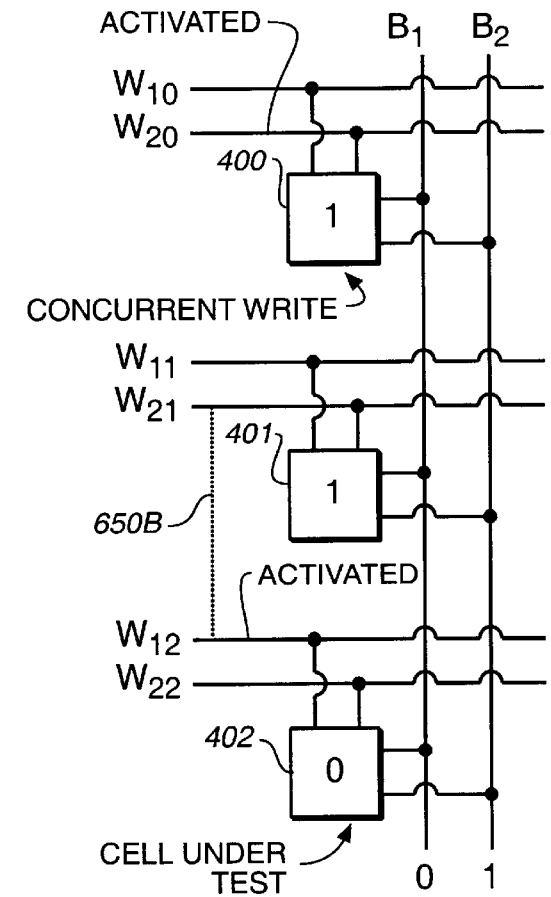
FIG._6A       FIG._6B

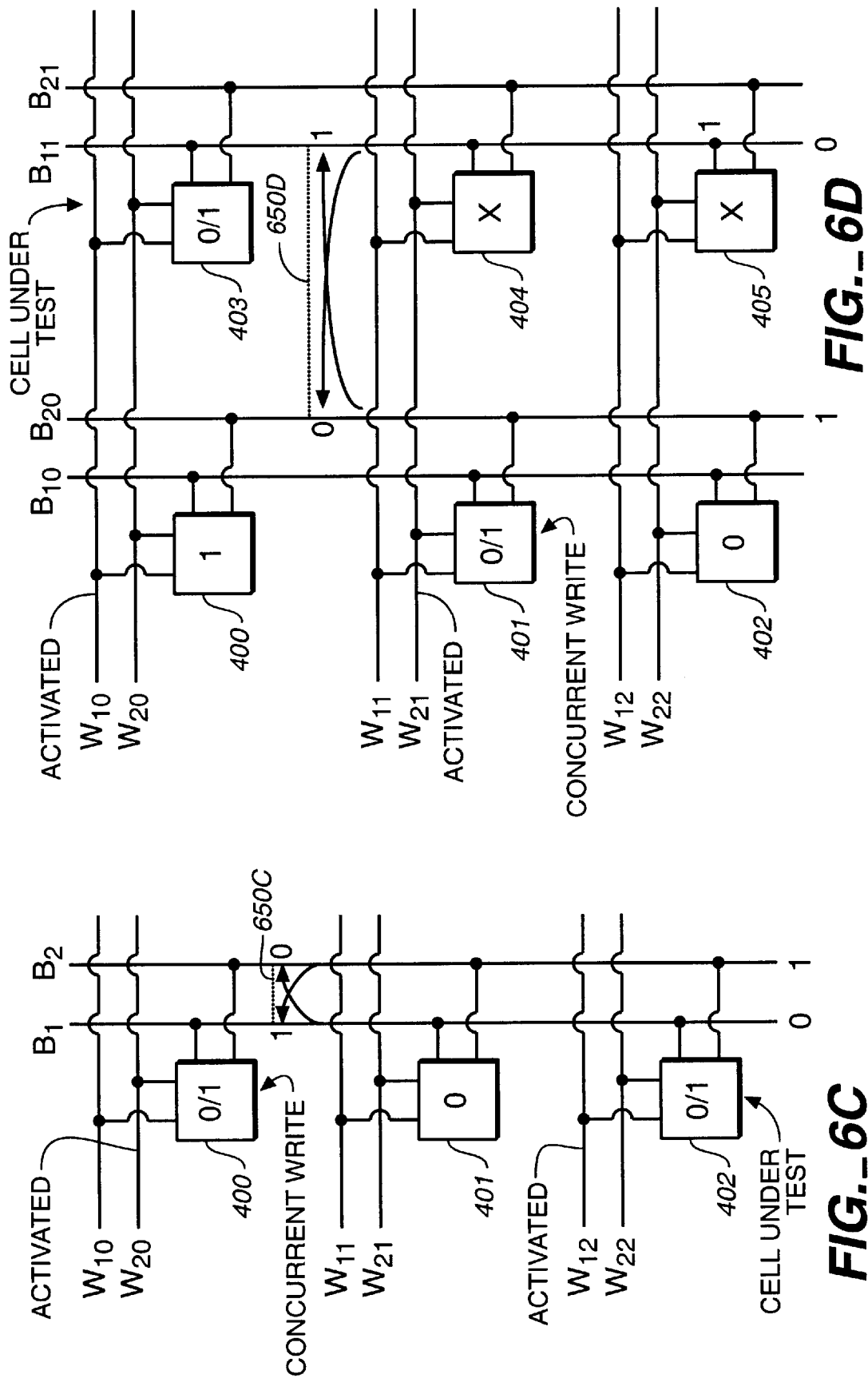

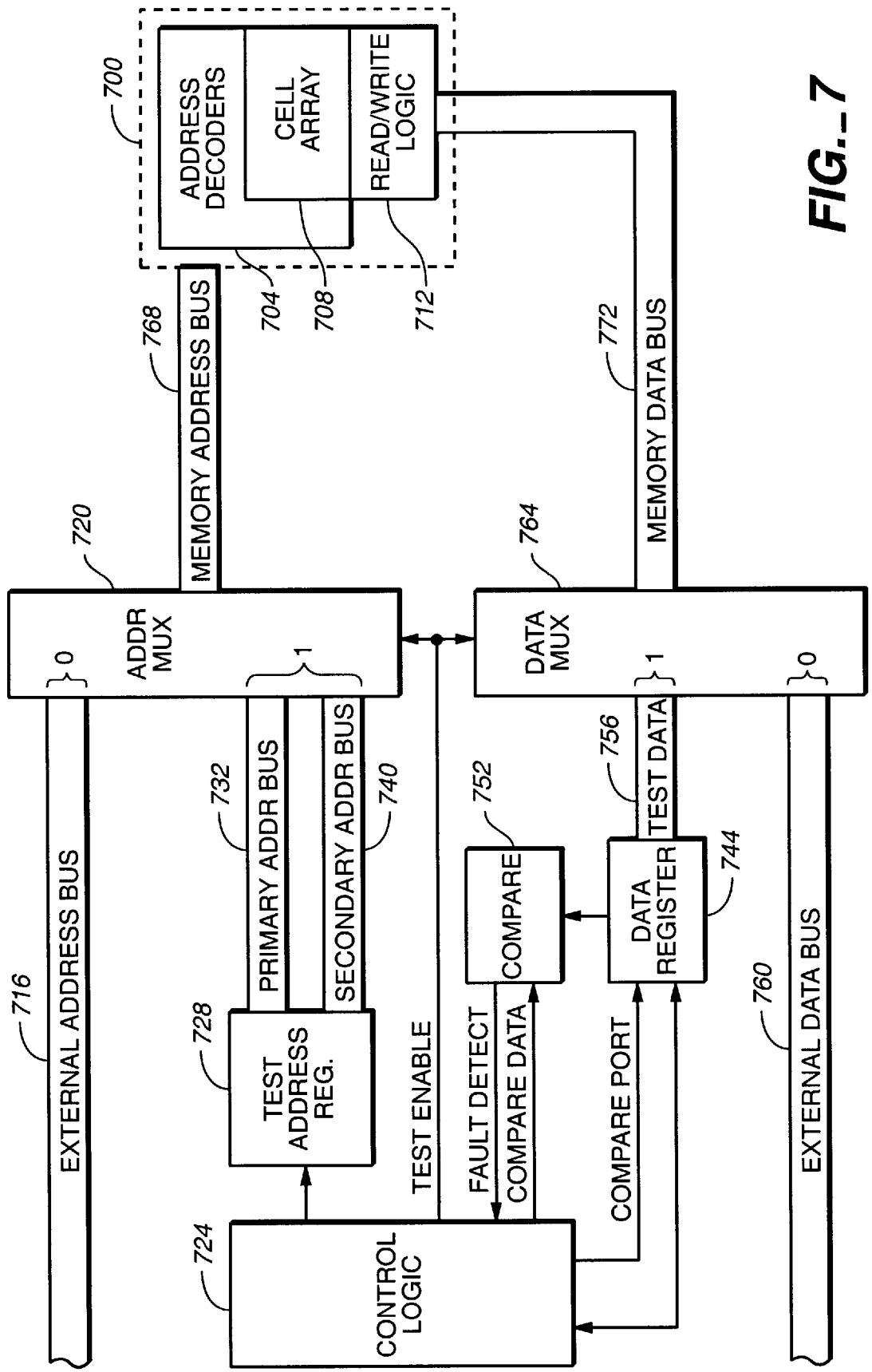

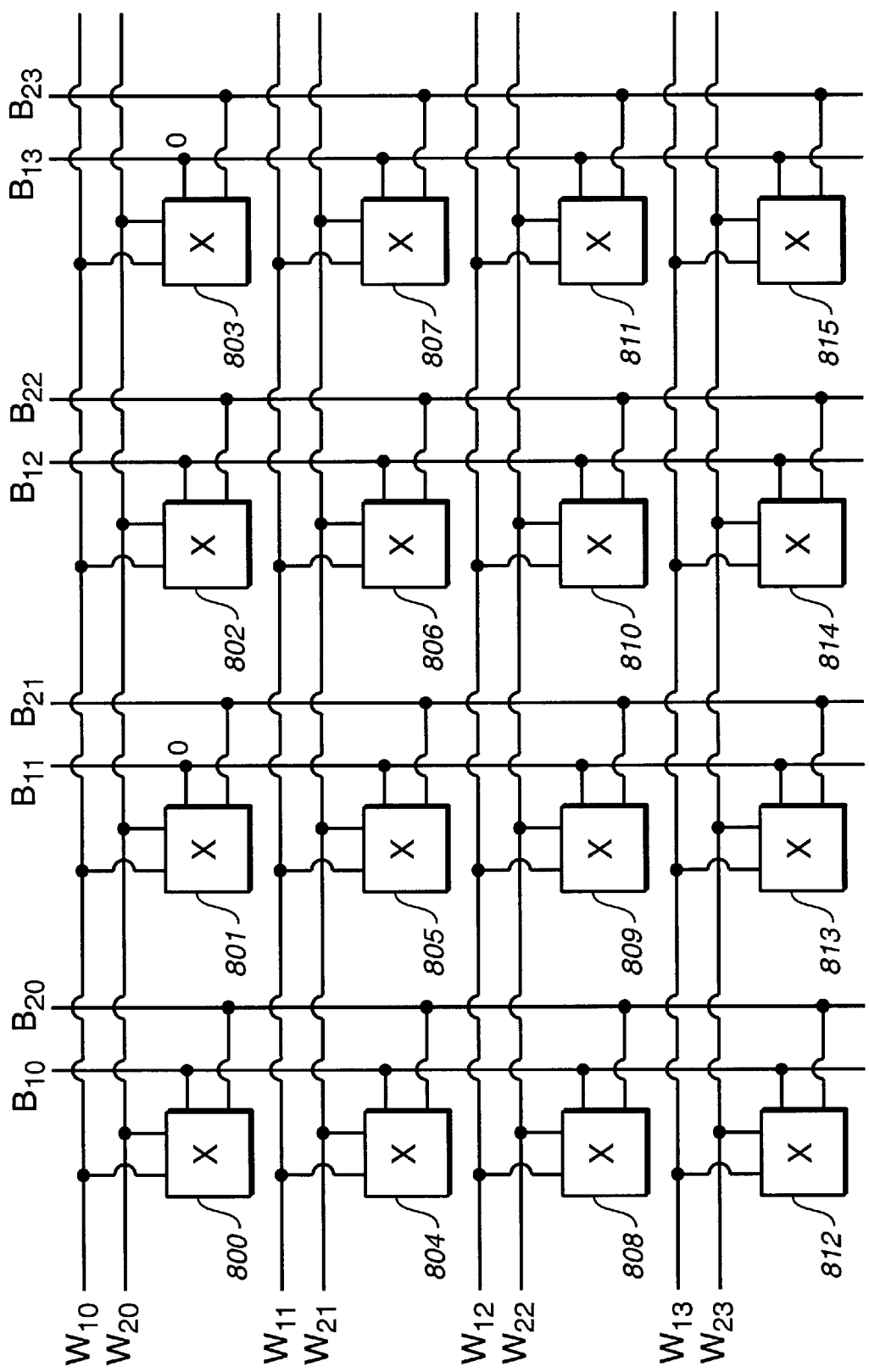
FIG._8

DETECTING INTERPORT FAULTS IN MULTIPORT STATIC MEMORIES

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The present invention relates generally to memory devices and particularly to multiport static memory devices. More particularly, the present invention relates to detecting interport faults in static memory devices.

BACKGROUND OF THE INVENTION

Multiport Architecture

Fast, efficient testing is an important step in manufacturing memory chips, and the price paid for recent advances in semiconductor technology has been a lengthier and more complicated testing process. A common feature of current memories is the presence of multiple "ports," or gateways that allow data to be read from and/or written to the memory. The ports on a multiport memory are designed to function independently, allowing the reading or writing of data in multiple locations at the same time. Prior memories, which had a single memory port, could only read or write data in one memory location at a time. Multiple ports thus increase memory throughput, or the speed at which data can be transferred to and from memory.

FIG. 1 illustrates a representative multiport memory device 150, comprising an array of memory cells 100, 101, 109, 110, 111, 119, 190, 191 and 199. As shown in FIG. 1, the cells are organized into R rows and C columns, where R and C can be any values. Cells 100 and 101 represent the first two columns of the first row, and cell 109 represents the last (or C-$1^{th}$) column of the first row. Similarly, cells 110, 111, and 119 represent the first, second, and last columns of the second row. In the final (or R-$1^{th}$) row, cells 190, 191, and 199 occupy the first, second, and last columns, respectively. Each memory cell is capable of storing an electric charge, and the charges can be manipulated to store and recall data through the use of special control circuitry (not shown) in the memory 150. Each memory cell can represent one of two values, depending on whether or not the cell holds a charge. The values 1 and 0 are often used to represent the charged and uncharged states, respectively, although the reverse may be true. Because the cells can hold either of two possible values, the memory device 150 is called a "binary" device, and the cell data values are known as binary digits, or "bits."

To fetch and store the data values, the memory device 150 includes "word line" and "bit line" signals that couple to the cells. The word line signals connect cells in the same row and are used to activate the cells along one row at a time. The bit line signals connect cells in the same column and are used to carry data to and from the activated cells. In a multiport device, each port has its own word lines and bit lines. The memory device 150 in FIG. 1 is shown with P ports, where P can be any number but is typically less than or equal to 11 under current technology.

The first port includes a first word line $W_{10}$ that connects the cells 100, 101, and 109 in the first row; a second word line $W_{11}$ that connects the cells 110, 111, and 119 in the second row; and additional word lines for the other rows, including a word line $W_{P(R-1)}$ that connects the cells 190, 191, and 199 in the final row. The first port also comprises a first bit line $B_{10}$ that connects the cells 100, 110, and 190 in the first column; a second bit line $B_{11}$ that connects the cells 101, 111, and 191 in the second column; and additional bit lines for the remaining columns, including a bit line $B_{P(C-1)}$ that connects the cells 109, 119, and 199 in the final column. To read data from the first row of cells through the first port, for example, the word line $W_{10}$ is activated. In response to activating the word line $W_{10}$, cells 100 and 101 place their data values onto bit lines $B_{10}$ and $B_{11}$, respectively. Similarly, the other cells in the first row drive their bit lines on the first port with the stored data, including cell 109, which drives bit line $B_{1(C-1)}$ with the data value stored in cell 109.

The word lines and bit lines also can be used to store data in the cells. To write data to the cells in the second row through the first port, for example, the word line $W_{11}$ is asserted to activate the cells in the second row, including cells 110, 111, and 119. At the same time, the values being stored are placed on the bit lines belonging to the first port, including bit lines $B_{10}$, $B_{11}$, and $B_{1(C-1)}$. In response, the cells on the second row store the data encoded by the bit lines. Cell 110 thus stores the value of bit line $B_{10}$, cell 111 stores the value of bit line $B_{11}$, and cell 119 stores the value of bit line $B_{1(C-1)}$.

Similarly, the remaining ports include word lines and bit lines for accessing the memory cells. Ideally, one port can access any row of cells while another port is accessing another row of cells without interference between the two ports, since the ports do not share word lines and bit lines. In reality, however, manufacturing defects can cause one port to interfere with another port, affecting the data values that are read or written through either port. Other manufacturing defects can cause individual cells to interact unreliably. Memory defects are generally classified as cell faults, addressing faults, read/write logic faults, and interport faults.

Cell Faults

Cells faults generally include defects known as unlinked faults, coupling faults, linked faults, neighborhood pattern sensitive faults, and complex coupling faults. Unlinked faults represent faults that occur in specific cells, without regard to a particular port or to the values of nearby cells. Types of unlinked faults include stuck-at faults, in which a cell holds a particular data value permanently; transition faults, in which a cell cannot make a transition between two values; and data retention faults, in which a cell fails to retain the correct logic value after a period of time. Table I summarizes unlinked faults.

TABLE I

Unlinked cell faults

| Name | Description |
| --- | --- |
| Stuck-At Fault | Cell holds either a 0 or a 1 permanently. |
| Transition Fault | Cell cannot transition from 1 to 0, or cell cannot transition from 0 to 1. |
| Data Retention Fault | Cell loses data after a period of time. |

Coupling faults represent faults in which writing a value to one cell influences the data value of another cell. Coupling faults include inversion faults, in which inverting the value of a first cell inverts the value of a second cell; idempotent faults, in which inverting the value of a first cell causes a particular value (either a 1 or a 0) to be stored in a second cell; bridging faults, in which two cells are shorted together; state faults, in which a first cell is forced to a certain value if and only if a second cell holds a particular value; and disturbance faults, in which a first cell changes value in response to a read or write operation in a second cell. Bridging faults can behave as one of two types: AND-type or OR-type. In an AND-type fault, a first cell is forced to 0 if and only if a 0 is stored in second cell. In an OR-type fault, a first cell is forced to 1 if and only if a 1 is stored in a second cell. Table II summarizes coupling faults.

TABLE II

Coupling cell faults

| Name | Description |
| --- | --- |
| Inversion Fault | Inverting the value of one cell causes an inversion in another cell. |
| Idempotent Fault | Inverting the value of one cell causes another cell to hold a specific value (either a 1 or a 0). |
| Bridging Fault | Storing a 0 in a cell causes another cell to hold a 0, but storing a 1 in the cell does not affect the other cell (AND-type). Storing a 1 in a cell causes another cell to hold a 1, but storing a 0 in the cell does not affect the other cell (OR-type). |
| State Fault | A first cell is forced to either 1 or 0 if and only if a second cell holds a particular value. |
| Disturbance Fault | Reading or writing one cell inverts the value of another cell. |

Other cell faults include linked faults, neighborhood pattern sensitive faults, and complex coupling faults. Linked faults comprise multiple coupling faults which occur when three or more cells interact to form faults. A first cell, for example, may affect the value of a second cell, which affects the value of a third cell. In another linked fault scenario, the first and third cells both affect the value of the second cell. The other previously discussed cell faults, by contrast, each occur between a single pair of cells. Neighborhood pattern sensitive faults typically appear as stuck-at, transition, or two-cell coupling faults, but only occur when nearby cells are in a particular state. Complex coupling are weak coupling faults that tend to occur only when multiple ports access the memory simultaneously. Table III summarizes these other cell faults.

TABLE III

Other cell faults

| Name | Description |
| --- | --- |
| Linked Fault | Involves two or more basic cell faults. |
| Neighborhood Pattern Sensitive Faults | A stuck-at, transition, or coupling fault that occurs when a neighboring cell is in a particular state. |
| Complex Coupling Fault | Weak coupling fault that tends to occur only when multiple ports simultaneously access a memory cell. |

Addressing and Read/Write Faults

To access memory cells, an address value corresponding to the desired cells must be provided to the control circuitry of the memory device. In response, the control circuitry activates the desired cells by asserting the word lines that correspond to the received addresses. Addressing faults occur when no cell is accessed for a given address, multiple cells are accessed simultaneously for a single address, when a cell is not accessible, or when a cell is activated for multiple addresses. Read/write faults either prevent read and/or write operations or permanently set the memory device to read or write. Addressing faults typically stem from defects in the control circuitry, while read/write faults can be caused by defects in the control circuitry or in the individual cells.

Interport Faults

Due to manufacturing defects such as short circuits and capacitive coupling between the ports, interport faults may occur when two or more ports access memory in parallel. Interport faults may be generally classified as word line shorts at the same row, word line shorts between adjacent rows, bit line shorts at the same column, and bit line shorts between adjacent columns. Word line shorts at the same row occur when activating a word line belonging to a first port causes the word line of a second port on the same row of memory cells to activate. For example, if word line $W_{10}$ (port 1, row 0) is shorted (or connected) to word line $W_{20}$ (port 2, row 0), then activating word line $W_{10}$ will activate word line $W_{20}$ (and vice versa) if the short behaves as an OR-type short, resulting in a word line short at the same row. If the short behaves as an AND-type short, however, then word line $W_{10}$ can be activated only if word line $W_{20}$ is activated at the same time, and vice versa. Word line shorts between adjacent rows happen when a word line on one port affects the word line of a different port on an adjacent row. If word line $W_{20}$ (port 2, row 0) is shorted to word line $W_{11}$ (port 1, row 1), for example, then activating word line $W_{11}$ causes word line $W_{20}$ to activate if the short behaves as an OR-type short, resulting in a word line short between rows. Similarly, an AND-type short between word lines $W_{11}$ and $W_{20}$ will prevent either word line from being activated unless the other word line is also activated at the same time.

Bit line shorts at the same column occur when two bit lines on different ports, but in the same column, are connected. For example, a bit line short occurs if bit line $B_{11}$ (port 1, column 1) connects to bit line $B_{21}$ (port 2, column 1). The result of a short between bit line $B_{11}$ and $B_{21}$ is that when $B_{21}$ is asserted, $B_{11}$ is asserted (and vice versa). Bit line shorts between columns occur when the bit line of one port is shorted to the bit line of another port in an adjacent column. If asserting bit line $B_{11}$ (port 1, column 1) asserts bit line $B_{20}$ (port 2, column 0), then the resulting defect is known as a bit line short between columns. Table IV summarizes the basic types of interport faults.

TABLE IV

Interport faults.

| Name | Description |
| --- | --- |
| Word line fault at same row | Word lines of different ports are shorted at the same row. |
| Word line fault between rows | Word lines of different ports are shorted at adjacent rows. |
| Bit line fault at same column | Bit lines of different ports are shorted at the same column. |
| Bit line fault between column | Bit lines of different ports are shorted at adjacent columns. |

FIG. 2A illustrates a word line fault, using cells 100 and 110 as an example, at the first row of the memory array. As in FIG. 1, port 1 comprises word line $W_{10}$ driving cell 100, word line $W_{11}$ driving cell 110, and bit line $B_{10}$ serving as the input/output signal for cells 100 and 110. Similarly, port 2 comprises word line $W_{20}$ driving cell 100, word line $W_{21}$ driving cell 110, and bit line $B_{20}$ serving as the input/output signal for cells 100 and 110. Further, memory cell 100 holds a logic 0 value, and memory cell 110 holds a logic 1. As shown, a short 200 exists between word lines $W_{10}$ and $W_{20}$. If the short behaves as an OR-type short, then word line $W_{20}$ becomes activated when word line $W_{10}$ is activated, and word line $W_{10}$ becomes activated if word line $W_{20}$ becomes activated. In the example of FIG. 2A, a memory read operation is performed on each port. Specifically, port 1 activates word line $W_{10}$ to read the value of cell 100, and port 2 activates word line $W_{21}$ to read the value of cell 110. Cell 100 responds to the activation of word line $W_{10}$ by placing a logic 0 onto bit line $B_{10}$, and cell 110 responds to the activation of word line $W_{21}$ by placing a logic 1 onto bit line $B_{20}$. An OR-type short between word lines $W_{10}$ and $W_{20}$ activates word line $W_{20}$, causing cell 100 to place a logic 0 value onto bit line $B_{20}$. Thus, both cells 100 and 110 drive bit line $B_{20}$ with different values, resulting in a conflict on port 2. If the short 200 behaves as an AND-type short, then word line $W_{20}$, which is deactivated, prevents word line $W_{10}$ from activating, thus preventing the read operation of cell 100.

FIG. 2B illustrates a word line fault between the first and second rows of the memory array, thus affecting cells 100 and 110. FIG. 2B also depicts a cell 120 on the third row of the array, coupled to word line $W_{12}$ (port 1) and word line $W_{22}$ (port 2). Cell 120 also couples to bit lines $B_{10}$ (port 1) and $B_{20}$ (port 2). As shown, memory cell 100 holds a logic 0 value, cell 110 holds a logic 1 value, and cell 120 holds a logic 0 value. A short 225 exists between word lines $W_{20}$ and $W_{11}$. If the short 225 behaves as an OR-type short, and if either word line $W_{20}$ or word line $W_{11}$ is activated, then the other word line becomes activated. If the short 225 behaves as an AND-type short, however, then neither word line $W_{20}$ nor $W_{11}$ can activate unless the other activates. In the example of FIG. 2B, a first read operation of cell 100 is performed on port 2 by activating word line $W_{20}$, and a second read operation of cell 120 is performed on port 1 by activating word line $W_{12}$ concurrently. Accordingly, cell 100 outputs a logic 0 value onto bit line $B_{20}$, and cell 120 drives bit line $B_{10}$ with a logic 0 value. If the short 225 behaves as an OR-type short, then word line $W_{11}$ is also activated, causing cell 110 to output its logic 1 value onto bit line $B_{10}$. Consequently, a conflict exists on bit line $B_{10}$ between the logic 1 value output by cell 110 and the logic 0 value output by cell 120. If the short 225 behaves as an AND-type short, however, then word line $W_{11}$, which is not activated, holds word line $W_{20}$ low, and the read operation of cell 100 fails.

FIG. 2C illustrates a bit line fault at the same column, using cells 100 and 110 in the first column of the memory array. As shown, cell 100 holds a logic 0 value, and cell 110 holds a logic 1 value. A first read operation is performed on cell 100 through port 1 by activating word line $W_{10}$, and a second read operation is performed on cell 110 through port 2 by activating word line $W_{21}$. Cell 100 thus drives bit line $B_{10}$ with a logic 0 value, and cell 110 drives bit line $B_{20}$ with a logic 1 value. A short 250 exists between bit lines $B_{10}$ and $B_{20}$, however, causing bit lines $B_{10}$ and $B_{20}$ to always hold the same value. Because bit lines $B_{10}$ and $B_{20}$ are shorted together but driven with different values, the value on one of the bit lines will be incorrect. Either bit line $B_{10}$ will improperly carry a logic 1 value, or bit line $B_{20}$ will improperly carry a logic 0 value.

FIG. 2D illustrates a bit line fault between column 1 of the memory array, which comprises cells 100 and 110, and column 2 of the array, which includes cells 101 and 111. Cells 100 and 101 reside at row 0 of the array, coupling to word line $W_{10}$ (port 1) and word line $W_{20}$ (port 2). Similarly, cells 110 and 111 reside at row 1 of the array, coupled to word line $W_{11}$ (port 1) and word line $W_{21}$ (port 2). Cells 100 and 110 form the first column of the array, coupling to bit line $B_{10}$ (port 1) and bit line $B_{20}$ (port 2). Similarly, cells 101 and 111 form column 2, coupling to bit lines $B_{11}$ (port 1) and $B_{21}$ (port 2). Cells 100 and 101 hold logic 0 values, and cells 110 and 111 hold logic 1 values. In the example, a read operation is performed on port 2 at row 0 of the array by activating word line $W_{20}$, causing cells 100 and 101 to drive bit lines $B_{20}$ and $B_{21}$, respectively, with logic 0 values. Similarly, a read operation is performed on port 1 at row 1 of the array by activating word line $W_{11}$, causing cells 110 and 111 to drive bit lines $B_{10}$ and $B_{11}$, respectively, with logic 1 values. A short 275 exists, however, between bit lines $B_{20}$ and $B_{11}$, so that any value carried on bit line $B_{20}$ is transferred to bit line $B_{11}$, and vice versa. As a result, bit lines $B_{20}$ and $B_{11}$ are driven by both logic values 0 and 1, resulting in a bit line fault.

In the examples of FIGS. 2A–D, the shorts 200, 225, 250, and 275 resulted in conflicting values on the bit lines because some cells drove shared bit lines with conflicting values. Note that if a pair of cells drives the same bit line with the same value (i.e., if two cells place a 0 value onto a bit line), then a fault may not be apparent. For example, the short 200 between word lines $W_{10}$ and $W_{20}$ in FIG. 2A will not affect the output values on bit lines $B_{10}$ and $B_{20}$ if cells 100 and 110 hold the same value (i.e., both hold a logic 0 value or both hold a logic 1). If cells which are driving the same bit line hold different values, however, then the bit line will carry either a 0 or 1 value, depending on the nature of the short. An AND-type fault occurs when a bit line is driven with a 0 value from one cell and a 1 value from another cell, and the bit line appears to carry the 0 value (as if the conflicting values were logically AND-ed). An OR-type fault occurs when a bit line is driven with a 0 value from one cell and a 1 value from another cell, and the bit line appears to carry the logic 1 value (as if the conflicting values were logically OR-ed).

Testing Interport Faults

Memory faults are unacceptable, so memory devices are thoroughly tested during the manufacturing process and discarded if any faults are detected. In the last few years, various techniques have been proposed for modeling and testing memory devices. Most of these techniques deal with single-port memories and do not apply to multiport memory chips. Single port memories usually are tested using a technique called the March C algorithm, for example, or a variant of March C such as the March C–, March C+, Smarch, or March LR algorithm.

The March C Algorithm includes six "passes," each of which addresses each memory cell individually. During Pass 1, March C writes a test pattern into the cells. The test pattern may be any desired sequence of bits, such as a "checkerboard" pattern, but often comprises all 0's. The 0 values can be written in any order, although the cells usually are addressed consecutively from address 0 to address N–1 or from address N–1 to address 0, where N represents the number of bits in the memory. Note also that N may represent the number of memory words, if desired, and the test may operate by addressing entire words instead of individual bits. Passes 2–5 also address each cell consecutively, executing two operations in sequence at each address. Passes 2 and 3 address the memory from address 0 to address N−1. During the first operation at each address in Pass 2, the test reads the current address to verify the value that was written during Pass 1. If the read operation does not return value that was written during Pass 1, then a fault is detected. The fault may have occurred either during the write operation of Pass 1 or the read operation of Pass 2 (or both). Next, the test inverts (or "complements") the data value of the current address. Thus, if the current cell holds a 0 value, then the test writes a 1 value to the cell, and vice versa. Similarly, the first operation of Pass 3 performs a read operation to verify the value written in Pass 2, and the second operation writes the inverted value to the cell. If the read operation returns a value different that the one written in Pass 2, then a fault is detected.

Passes 4–5 address the memory from cell N−1 to cell 0. The first operation in Pass 4 reads the current cell to verify the value that was written during Pass 3, and the second operation inverts the value through a write operation. Similarly, each iteration of Pass 5 first reads the value of the current cell to verify the value that was written during Pass 4 and then writes a complemented value to the cell. If the wrong value is read during any iteration of Pass 4 or Pass 5, then a fault is detected. Such a fault may have occurred during the read operation itself or during the previous write operation (or both). During Pass 6, the test reads each cell to verify the value that was written during Pass 5. As in Pass 1, the cells may be addressed in any order but preferably are accessed from address 0 to address N−1 or from address N−1 to address 0. If the wrong value is detected in any cell during Pass 6, a fault is detected. Table V summarizes the operations of the March C Algorithm in which the initial test pattern is zero for each cell.

TABLE V

March C Algorithm.

| Pass | Start Address | End Address | Operation 1 | Operation 2 |
|---|---|---|---|---|
| 1 | 0 or N-1 | N-1 or 0 | Write 0 to Address | None |
| 2 | 0 | N-1 | Read 0 from Address | Write 1 to Address |
| 3 | 0 | N-1 | Read 1 from Address | Write 0 to Address |
| 4 | N-1 | 0 | Read 0 from Address | Write 1 to Address |
| 5 | N-1 | 0 | Read 1 from Address | Write 0 to Address |
| 6 | 0 or N-1 | N-1 or 0 | Read 0 from Address | None |

Unfortunately, the March C algorithm cannot detect interport faults which occur in multiport memories. Though alternative techniques have been developed to detect interport faults, most of these techniques fail to detect all of the possible interport faults. Other techniques require modifications to the memory device. Such modifications, however, may be prohibitively expensive to mass produce or may prove incompatible with the needs of the end user. Still other techniques require a large number of tests, and thus extensive testing time, unless detailed structural information about the memory is known. Although some techniques have been developed to effectively test interport faults, many of these tests cover only interport faults, failing to detect other types of faults. Other techniques which cover interport faults make the assumption that all ports are read/write ports, so faults that occur between read-only ports and between write-only ports are not detected.

For the foregoing reasons, an efficient and reliable technique for detecting interport memory faults would greatly improve the manufacture and testing of memories. Such a technique, if devised, should cover all possible interport faults as well as faults that occur in single port memories, without requiring excessive testing time. Further, the technique should be applicable to any type of memory design without requiring modifications to the cell architecture and should cover read-only ports, write-only ports, and read/write ports. Despite the apparent advantages that such a technique would provide, no device or method provides these features.

SUMMARY OF THE INVENTION

Accordingly, the present invention discloses a multiport testing procedure capable of detecting faults that occur between memory ports as well as traditional cell faults. The multiport test uncovers all possible faults and covers all cells in the memory, without placing architectural constraints on the memory. While executing a test sequence on one port of the memory array (called the "test port"), concurrent memory accesses are performed through other ports in the memory. If a fault exists between the port under test and any other port, then the concurrent operations interfere with the values read and/or written on the port under test, and the test uncovers the fault. Thus, the interport test requires only as many memory operations as the associated single port test, thus keeping test time to a minimum.

In one embodiment, the multiport test detects faults between the test port, which is capable of both read and write operations, and any other port, including read ports and write ports. Note that the "one test port" may consist of two ports, such as a read-only port combined with a write-only port, to provide both read and write functionality. The test port may also consist of at least one read/write port that is used only for read operations or only for write operations during the test. Accordingly, the test port may comprise a "read test port" and a "write test port."

The multiport test comprises six passes through the memory. During Pass 1, the procedure writes a test pattern to the cells. During Passes 2–5, the test addresses each memory cell consecutively over the test port, either from address 0 to address N−1 or from address N−1 to address 0. At each cell, the test executes a read operation through the test port, to verify the data that was written during the previous pass, and then executes a write operation through the test port. The write operation inverts the value of the cell. Pass 6 again reads the cells to verify the values written during Pass 5.

During the read operation on the test port, the test executes a concurrent read operation on all other ports in the memory. The concurrent read operation occurs at the cell that is two addresses behind the test read, which corresponds to the test address −2 if the test addresses are incrementing from 0 to N−1, or which corresponds to the test address +2 if the test addresses are decrementing from N−1 to 0. If a fault exists between the test port and any other port near the cell under test, the concurrent operation will excite the fault, possibly affecting the data value that is read from the cell. Accordingly, if the read operation returns the complement of the value that is expected, then the fault is detected.

During the write operation, the test executes concurrent read operations through all other memory ports. If the test port is formed from two separate ports, i.e., a read test port and a write test port, then the concurrent operation also occurs on the test read port. If a single port is used for both read and write operations (i.e., if the test port is a single read/write port), then the concurrent read operation does not occur on the test port. The concurrent operations occur two cells ahead of the write address. Thus, if the test address is incrementing from 0 to N–1, the concurrent read occurs at the test address +2. If the test address is decrementing from N–1 to 0, however, then the concurrent read occurs at the test address –2. If a fault exists between the test port and any other port, then the fault may cause a write error. The write error then can be detected during a subsequent read operation.

In another embodiment, a multiport test for detecting faults between write ports comprises four memory passes. Pass 1 addresses the memory cells consecutively, writing a predetermined data pattern to the cells through the test port. At each cell, the memory test follows the write operation with a read operation at the previous cell, in order to verify the data that was written during the previous iteration. Also at each cell, the memory test performs a concurrent write in parallel with the test write. The concurrent write stores the complement of the value stored by the test write operation. Further, the concurrent write occurs on a different port than the test write, so if a fault exists between the test port and the concurrent port, then either the test write or the concurrent write fails. Pass 2 comprises reading the cells to verify the integrity of the write operations during Pass 1. If an interport fault causes a write error during Pass 1, then either the read operation of Pass 1 or the read operation of Pass 2 will detect the fault, depending on the location of the fault.

Pass 3 comprises substantially the same procedure as Pass 1, except that the data write values are complemented during Pass 3. Thus, the test write operation in Pass 3 writes the complement of the data pattern written by the test write in Pass 1, and the concurrent write operation in Pass 3 writes the complement of the data pattern written by the concurrent write during Pass 1. As in Pass 1, the test write occurs through the test port, and the concurrent write occurs through a different port, at two addresses behind the test address. Following each test write operation, the test executes a read operation one cell behind the test write operation, to verify the test write operation of the previous iteration. If the read operation returns the complement of the value written by the test write, then a fault is discovered. Pass 4 comprises reading the memory cells again to verify the write values. If a fault induces a write error in the concurrent cell during Pass 3, then Pass 4 will detect the error and, thus, the fault.

An embodiment of a memory test circuit that implements the multiport memory tests includes an address register that specifies the memory locations for all test and concurrent operations, a data register that transmits and receives data during read and write operation, a comparator that verifies data values read into the data register, and a control logic that manages operation of the other components. The address register drives a test address bus, which carries the address of each test operation, and a concurrent address bus, which carries the address of each concurrent operation. Similarly, the data register drives an internal data bus that carries data during a memory test. The test circuit also includes an address multiplexer that switches between external address lines and the internal address lines used for the test. A data multiplexer is further included for switching between the internal data lines used for the test and external data lines. The control logic asserts a test enable signal to select the state of the multiplexers, thus allowing the control logic to execute read and write operations through the multiplexers via the address and data registers.

Thus, the present invention comprises a combination of features and advantages that enable it to substantially advance the art by providing a method and apparatus for testing interport faults. These and various other characteristics and advantages of the present invention will be readily apparent to those skilled in the art upon reading the following detailed description of the preferred embodiments of the invention and by referring to the accompanying drawings.

BRIEF DESCRIPTION OF THE DRAWINGS

A better understanding of the present invention can be obtained when the following detailed description of preferred embodiments is considered in conjunction with the following drawings, in which:

FIG. 1 illustrates a prior art static random access memory array;

FIGS. 2A–D illustrate interport faults;

FIGS. 3A–C illustrate flowcharts of a multiport read test in accordance with a preferred embodiment;

FIGS. 4A–H illustrate faults detected by the multiport test of FIGS. 3A–C;

FIGS. 5A–B illustrate flowcharts of a multiport write test in accordance with a preferred embodiment;

FIGS. 6A–D illustrate faults detected by the multiport test of FIGS. 5A–B;

FIG. 7 illustrates a memory test circuit, shown coupled to an exemplary memory array and capable of executing the multiport tests of FIGS. 3A–C and 5A–B; and FIG. 8 depicts an exemplary cell array addressed according to the column fast convention.

DETAILED DESCRIPTION OF THE PREFERRED EMBODIMENTS

While executing a test sequence on one port of the memory array (the "test port"), concurrent memory accesses are performed through other ports in the memory. If a fault exists between the port under test and any other port, then the concurrent operations will interfere with the values read and/or written on the port under test, and the test will uncover the fault. The test sequence executed on the test port may be any suitable test sequence, now known or later discovered, for testing one or more memory ports. A preferred embodiment for detecting interport faults between a read port (i.e., a read/write port or a read-only port) and any other type of port (i.e., a write-only, read/write, or read-only port), herein referred to as the read interport test, envisions performing the March C algorithm to exercise the test port. Thus, the read interport test also comprises six passes. The read interport tests detects faults between the test port, which is a single read/write port or a read port paired with a write port, and any other port with a read capability, including read-only ports and read-write ports.

Pass 1 of the read interport test writes the test pattern, which preferably consists of logic 0 for each cell, to the memory array. No concurrent operations are required during Pass 1. In Passes 2–5, the read interport test comprises performing a test read operation and a test write operation, as in the March C algorithm. In addition, Passes 2–5 include a first concurrent read operation performed during the test read and a second concurrent read operation performed during the test write. The first and second concurrent reads are performed in parallel through all read ports except for the port under test. If the test port comprises a test read port combined with a separate test write port, then the second concurrent read is also performed through the test read port. During Pass 6, the read interport test reads back the data written during Pass 5, and no concurrent operations are required.

Although the concurrent operations may occur at any desired cell, the testing procedure preferably executes the concurrent read operation at a different cell than the cell being accessed by the port under test. In a preferred embodiment, the first concurrent operation occurs at the cell which was accessed by the test port two iterations prior to the current operation, or two addresses "behind" the current test port address. If the cells are being traversed from address 0 to address N−1, for example, then the first concurrent read is performed at address x−2 when the test read is performed at address x. Similarly, if the cells are being traversed from address N−1 to address 0, then the first concurrent read is performed at address x+2 when the test read is performed at address x. For the first two iterations of a particular pass, the first concurrent operation is omitted.

Similarly, the second concurrent read operation, which occurs in parallel with the write operation on the test port, targets the cell that the test write will access two iterations after the current operation. Thus, the second concurrent operation occurs two cells "ahead" of the current address. If the cells are being traversed from address 0 to address N−1, for example, then the second concurrent read is performed at address x+2 when the test read is performed at address x. Similarly, if the cells are being traversed from address N−1 to address 0, then the second concurrent read is performed at address x−2 when the test read is performed at address x. For the final two iterations of a particular pass, the second concurrent operation is omitted. Note that the two concurrent operations for each iteration may occur at any desired address offset, although the address of the first concurrent operation preferably occurs at least two cells behind the test operation, and the address of the second concurrent operation preferably is at least two cells ahead of the test operation.

Table VI summarizes the operations of Passes 1–6 of the read interport test procedure, including the preferred cell addressing order and the addresses of the first and second concurrent read operations.

TABLE VI

Read Interport Test.

| Pass | Address Range | First Concurrent Operation (During Test Read) | Second Concurrent Operation (During Test Write) |
|---|---|---|---|
| 1 | 0 to N−1 | None | None |
| 2 | 0 to N−1 | Read Test Address − 2 | Read Test Address + 2 |
| 3 | 0 to N−1 | Read Test Address − 2 | Read Test Address + 2 |
| 4 | N−1 to 0 | Read Test Address + 2 | Read Test Address − 2 |
| 5 | N−1 to 0 | Read Test Address + 2 | Read Test Address − 2 |
| 6 | 0 to N−1 | None | None |

FIGS. 3A–C illustrate flow charts of a preferred embodiment of the read interport test procedure, and thus depict the procedure for detecting interport faults between read ports, between read and read/write ports, and between read and write ports. Referring initially to FIG. 3A, blocks 300–306 outline the procedure for Pass 1. Beginning with block 300, the current address (ADDR) is initialized to 0. Next, during block 302, the test procedure writes a 0 value to the memory cell at the current address, using the test port. In block 304, if the current address has reached N−1, which is the final address in the array, then the test procedure proceeds to block 308. Otherwise, the current address is incremented in block 306, and control returns to block 302.

Blocks 308 through 322 represent Pass 2. Beginning in block 308, the current address is set to zero. Next, in block 310A, the test procedure reads the cell at the current address, through the test port. If the current address is greater than or equal to 2 (block 312), then the test procedure performs read operations on all ports except for the test port, at the cell that is two addresses behind the current address (i.e., address −2). As indicated by the parallel dashed lines, blocks 310A and 310B are implemented concurrently, meaning that at least part of the operation of block 310B overlaps with at least part of the operation of block 310A. Because the value 0 was written to the cells during the previous pass (Pass 1), the read operation performed in block 310A should find a 0 value in the cell. Accordingly, if the read operation returns a 1 value, then a fault has occurred. A fault that is discovered in block 312 could represent any number of problems, including both cell faults and interport faults induced by one or more of the concurrent read operations in block 310B. The test procedure preferably continues if a fault is detected in block 312, although operation may stop if desired. In a preferred embodiment, the test procedure tracks the number of faults which occur during the test (not shown).

Following the read operations of blocks 310A and 310B, the test procedure writes a 1 value to the current address, using the test port (block 318A). If the current address is less than N−2, then concurrently with block 318A, the test procedure in block 318B performs read operations at the cell two addresses ahead of the current address (i.e., address +2). If the test port is formed from using a test read port and a separate test write port, the concurrent read operation of block 318B also occurs through the test read port. The concurrent read operations performed in block 318B may trigger an interport write error at the test port in block 318A. The test procedure will detect any such error either during a subsequent operation in Pass 2 or during a later pass. Following the concurrent operations 318A–B, if the current address is not equal to N−1 (block 320), then control returns to blocks 310A and 312. If the current address equals N−1 in block 320, however, then. Pass 2 ends, and the test procedure progresses to Pass 3.

FIG. 3B illustrates Pass 3 (blocks 324–340) and Pass 4 (blocks 342–356). Beginning with Pass 3 in block 324, the test address is reset to zero. Next, in block 328A, the test procedure reads the test port at the current address. If the current address is greater than or equal to 2, then the test procedure concurrently reads the cell two addresses behind the current cell, using each of the available read ports except for the test port. Because the test procedure wrote logic 1 values to the cells during Pass 2, the read result in block 328A should equal logic 1. If the read result is logic 0, then a fault is declared in block 330. Such a fault, if it is an interport fault, may have been caused by the concurrent read operations in block 328B or by the concurrent read operations in Pass 2 (block 318B). Next, a logic 0 value is written to the current cell in block 334A, using the test port. If the current address is less than N−2, then concurrently with block 334A, the test procedure performs concurrent read operations in block 334B at the cell two addresses ahead of the test address. If the test port is formed as a test read port combined with a separate test write port, then the concurrent read operation of block 334B also occurs through the test read port. Any interport fault caused by one or more of the concurrent read operations will be detected either during a subsequent iteration of Pass 3 or during a later pass. If the current address has not yet reached N−1 (block 338), then the address is incremented in block 340, and the procedure returns to blocks 326 328A. If the current address equals N−1, however, then Pass 4 begins.

Because Pass 4 begins at address N−1, which is the current address at the end of Pass 3, the current address need not be initialized at the beginning of Pass 4. Beginning with block 344A, Pass 4 reads the current cell. If the current address is less than N−2, then the test procedure performs read operations on all ports other than the test port (block 344B), at the cell two addresses higher than the current address, and concurrently with block 344A. Because the test procedure stored logic 0 values in each of the cells during Pass 3, the read operation in block 344A should return a logic 0 value. If read operation 344A returns a 1, then a fault is declared. Next, a logic 1 value is written into the cell using the test port (block 350A), and if the current address is greater than or equal to 2, then concurrent read operations are performed in parallel with block 350A, at the cell two addresses lower than the current address (block 350B). If the test port is formed as a test read port combined with a separate test write port, then the concurrent read operation of block 350B also occurs through the test read port. Next, if the current address equals zero (block 354), then the test procedure moves to Pass 5, as shown in FIG. 3C. Otherwise, control returns to blocks 342 and 344A for the next iteration of Pass 4.

FIG. 3C illustrates Pass 5, represented by blocks 360–376, and Pass 6, represented by blocks 380–386. Beginning with Pass 5, block 360 initializes the current address to N−1. Next, in block 364A, a read operation is performed over the test port. Concurrently, read operations are performed through the other ports (block 364) two addresses ahead of the current address, as long as the current address is less than N−2 (block 362). If the read operation of block 364A returns a logic 0 value, contrary to the logic 1 value written to the cell in block 350A of Pass 4, then a fault has occurred. Next, the test procedure writes a logic 0 value to the current cell (block 370A). If the current address is greater than or equal to 2, then the test procedure also performs read operations two cells below the current address on all of the read ports in block 370B, concurrently with the write operation in block 370A. If the test port is formed as a test read port combined with a separate test write port, then the concurrent read operation of block 370B also occurs through the test read port. As explained above, the concurrent read operations of block 370B and block 364B may trigger interport faults. Such faults will be detected either in block 364A by a subsequent iteration of Pass 5 or during Pass 6, as described below. Following block 370A, control proceeds to block 376 if the current address is greater than zero (block 374), or moves to block 380 to begin Pass 6 if the current address equals zero. Block 376 decrements the current address and returns to blocks 362 and 364A for another iteration of Pass 5.

Because the current address at the end of Pass 5 is zero, the address need not be initialized at the beginning of Pass 6. Pass 6 thus starts, at block 380, by reading the test port at the current address. Alternatively, another port may implement the read operation. Block 380 detects interport faults which occurred in Pass 5 during the write operation of block 357A, as long as no other cell fault prevents proper read operation in block 380. Because the write operation of block 370A stored a logic 0 value in each cell, an error is declared in block 366 if the read operation of block 380 returns a logic 1 value. Next, unless the current address equals N−1 (block 384), the current address is decremented (block 386) and control returns to block 380 for another iteration of Pass 6. If the current address has reached the final address N−1, however, then Pass 6 (and thus the read interport test procedure) ends.

The procedures summarized in Table VI and outlined in FIGS. 3A–C detect all types of interport faults between the test port and the other ports, including both AND-type and OR-type, and including word line shorts between rows, word line shorts at the same row, bit line shorts between columns, and bit line shorts in the same column.

FIG. 4A illustrates the detection of a short between word lines in the same row 450A using the read interport test. A portion of a memory array is depicted in FIG. 4A, comprising cells at three memory addresses 400, 401, and 402. The memory array is representative of a two port memory, having word lines $W_{10}$ (port 1) and $W_{20}$ (port 2) coupled to cell 400, word lines $W_{11}$ (port 1) and $W_{21}$ (port 2) coupled to cell 401, and word lines $W_{12}$ (port 1) and $W_{22}$ (port 2) coupled to cell 402. Bit lines $B_1$ (port 1) and $B_2$ (port 2) also couple to the cells 400–402. As shown, a word line short 450A exists between bit lines $W_{10}$ and $W_{20}$. In the example, the memory array is undergoing Pass 2 of the read interport test, in which port 1 represents the port under test, and the current test address is 402. Accordingly, the memory test has written logic 1 values to cells 400 and 401 during previous iterations, and cell 402 still holds the logic 0 that was written during Pass 1.

To initiate the test read operation on port 1 of cell 402, word line $W_{12}$ is activated. In response, cell 402 drives bit line $B_1$ with its logic 0 value. At the same time, word line $W_{20}$ is activated to read cell 400 concurrently (since cell 400 resides two addresses behind cell 402) on port 2. In response, cell 400 drives bit line $B_2$ with its logic 1 value. Because word line $W_{20}$ is shorted to word line $W_{10}$, however, word line $W_{20}$ may become activated, routing the logic 1 from cell 400 onto the bit line $B_1$, if the short 450A behaves as an OR-type short. Accordingly, bit line $B_1$ is driven with two conflicting values: a logic 1 from cell 400, and a logic 0 from cell 402. The conflicted bit line then will carry either a 1 value (if cell 400 drives the bit line $B_1$ more strongly than does cell 402) or a 0 value (if cell 402 drives the bit line $B_1$ more strongly than does cell 400). Because the test expects to read a 0 value from port 1 during Pass 2, the fault will be discovered if the bit line $B_1$ carries a 1 value. Similarly, if the bit line $B_1$ carries a 0 value, the fault will be discovered during Pass 3. Note that if the short 450A behaves as an AND-type short, then the deactivated word line $W_{10}$ will prevent word line $W_{20}$ from activating, and the concurrent operation will not succeed. The fault, however, will prevent writing to cell 400 unless both word lines $W_{10}$ and $W_{20}$ are activated, so the fault will be detected during another part of the test.

FIG. 4B illustrates a word line short 450B between port 2 of cell 400 (word line $W_{20}$) and port 1 of cell 401 (word line $W_{11}$). As in the previous example, the memory currently is undergoing Pass 2 of the read interport test in which port 1 represents the test port, and the test address is 402. Thus, the cells 400, 401, and 402 hold the values 1, 1, and 0, respectively. To read the value from cell 402, the test activates word line $W_{12}$, releasing the 0 value from cell 402 onto bit line $B_1$. Similarly, the concurrent operation reads the cell two addresses behind cell 402, or cell 400, by activating word line $W_{20}$. In response, cell 400 places its logic 1 value onto bit line $B_1$. Because word line $W_{11}$ is shorted to word line $W_{20}$, however, cell 401 is also activated if the word line short behaves as an OR-type short, releasing its logic 1 value onto bit line $B_1$ and causing a conflict with the logic 0 value driven onto the bit line by cell 402. If cell 400 drives the bit line $B_1$ more strongly than does cell 402, then the conflicted 0/1 value will appear as a logic 1, and the test will catch the fault. If cell 402 drives the bit line $B_1$ more strongly than does cell 400, however, then a later pass will catch the fault. If the short 450B behaves as an AND-type short, then the concurrent operation will not succeed, and no bit line conflict will occur. The fault, however, will prevent writing to cells 400 and 401 unless both word lines $W_{11}$ and $W_{20}$ are activated, so the fault will be detected during another part of the test.

FIG. 4C again illustrates cells 400–402, but with a bit line short in the same column 450C (between bit lines $B_1$ and $B_2$). As in the two previous examples of FIG. 4A and FIG. 4B, the cells 400–402 currently are undergoing the read interport test, with port 1 representing the test port and the current test address set to cell 402. Accordingly, the cells 400, 401, and 402 hold the values 1, 1, and 0, respectively. To perform the test read operation, word line $W_{12}$ is activated, and cell 402 responds by driving bit line $B_1$ with its logic 0 value. Concurrently, word line $W_{20}$ is activated, causing cell 400 to drive bit line $B_2$ with a logic 1 value. Because the two bit lines $B_1$ and $B_2$ carry different values in FIG. 4C, the short results in conflicting values on both bit lines. If the value of bit line $B_1$ appears as a logic 1, representing an OR-type fault, then Pass 2 will discover the conflict. Otherwise, if the short causes an AND-type fault, Pass 3 will detect the fault. Similarly, Pass 4 also will catch the fault if the short 450C is an OR-type short, or Pass 5 will catch the fault if the short 450C is an AND-type short, as long as cell 400 is at least two cells from the lowest address in the array.

FIG. 4D illustrates the detection of a short between bit lines in different columns 450D. For purposes of example, the memory array comprises three rows and two columns. The first column of cells 400, 401, and 402 couples to bit lines $B_{10}$ (port 1) and $B_{20}$ (port 2), and the second column of cells 403, 404, and 405 couples to bit lines $B_{11}$ (port 1) and $B_{12}$ (port 2). Cells 400 and 403 comprise the first row of the array, cells 401 and 404 make up the second row of the array, and the cells 402 and 405 form the third row. Thus, Passes 1–6 address the cells consecutively either from 400 to 405 or from 405 to 400. As in the previous examples of FIGS. 4A–C, the memory array is undergoing the read interport test on port 1 during Pass 2. As shown, the test address is set to cell 403, and cells 400–402 have stored logic 1 values during previous iterations. Because the test address is at cell 403, the concurrent operation on port 2 occurs at cell 401, which is two addresses consecutively behind cell 403 (since the array is traversed from cell 400 to cell 405). To read the value of cell 403 on port 1, word line $W_{10}$ is activated, and bit line $B_{11}$ receives the logic 0 value from cell 403. Concurrently, word line $W_{21}$ is activated to release the logic 1 value from cell 401 onto the port 2 bit line $B_{20}$. Because bit lines $B_{20}$ and $B_{11}$ are shorted together, the logic 1 value from cell 401 meets the logic 0 value in cell 403. If the short 450D behaves as an OR-type short, then the bit line $B_{11}$ will carry a 1 value, which Pass 2 will detect. If the short 450D behaves as an AND-type short, then bit line $B_{11}$ will carry a 0 value, which Pass 3 will detect. If the bit lines are physically laid out as $B_{20}$-$B_{10}$-$B_{21}$-$B_{11}$, instead of $B_{10}$-$B_{20}$-$B_{11}$-$B_{21}$ as shown, then Pass 4 will detect OR-type faults, and Pass 5 will detect AND-type faults.

FIG. 4E is illustrative of the state of the array of FIG. 4A during Pass 5, after cell 402 is tested. Before cell 402 is tested, cells 400, 401, and 402 hold logic 1 values which were written during Pass 4. Pass 5, which traverses the array from address N–1 to address 0 and thus reaches cell 402 before reaching cell 400, verifies that each cell contains a logic 1 and then writes a logic 0 to the cell. When Pass 5 first reaches cell 402, cells 400–402 each hold logic 1. After reading cell 402 to verify the logic 1 value, a 0 value is placed onto bit line $B_1$, and word line $W_{12}$ is activated to store the 0 value into cell 402. At the same time, word line $W_{20}$ is activated to perform the concurrent read of cell 400. If the short 450A between word lines $W_{10}$ and $W_{20}$ behaves as an OR-type short, however, word line $W_{10}$ is also activated, causing cell 400 to accept the logic 0 value on bit line $B_1$. When Pass 5 reaches cell 400, the errant logic 0 value will be detected during the test read operation on port 1. If the short 450A behaves as an AND-type short, then word line $W_{10}$ will not activate, and the value of cell 400 will remain at logic 1. The fault, however, will prevent writing to cell 400 unless both word lines $W_{10}$ and $W_{20}$ are activated, so the fault will be detected during another part of the test.

FIG. 4F depicts the state of the array of FIG. 4B during Pass 5, just after cell 402 is tested. As in FIG. 4B, a word line short 450B exists between word lines $W_{20}$ (port 2, cell 400) and $W_{11}$ (port 1, cell 401). Before cell 402 is tested, cells 400, 401, and 402 hold logic 1 values. Pass 5 first verifies the logic 1 value stored in cell 402 (and concurrently reads the value in cell 400). Next, bit line $B_1$ is driven with a logic 0 value, in order to write to cell 402 on port 1. To execute the concurrent read operation, word line $W_{20}$ is activated. If the short 450B behaves as an OR-type short, then word line $W_{11}$ activates, causing cell 401 to accept the logic 0 value from bit line $B_1$. When the test reads the value of cell 401 during the next iteration, the logic 0 value will be discovered, thus illuminating the fault 450B. If the short 450B behaves as an AND-type short, then word line $W_{11}$ will not activate, and the value of cell 401 will remain at logic 1. The fault, however, may prevent writing to cell 400 (through port 2) and to cell 401 (through port 1), unless both word lines $W_{20}$ and $W_{11}$ are activated at the same time. If so, then the fault will be detected during another part of the test.

FIG. 4G illustrates the state of the array of FIG. 4C during Pass 5, after the test of cell 402. As in FIG. 4C, a bit line short 450C exists between bit lines $B_1$ and $B_2$. Prior to testing cell 402, cells 400, 401, and 402 hold logic 1 values. After verifying that cell 402 holds a logic 1, bit line $B_1$ is driven with a logic 0 value, and word line $W_{12}$ is activated to store the 0 value into cell 402. Concurrently, word line $W_{20}$ is activated. Because of the short 450C, however, the logic 0 value on bit line $B_1$ travels to bit line $B_2$, and the activation of word line $W_{20}$ causes cell 400 to accept the logic 0 value. Two iterations later, Pass 5 will detect the logic 0 value in cell 400 when testing for logic 1, and the fault will be discovered.

In FIG. 4H, the read interport test has just completed the test of cell 403, during Pass 5. Prior to testing cell 403, cells 400–403 held logic 1 values, and cells 404–405 held logic 0 values (which were written during the previous two iterations). To test cell 403, the logic 1 value is verified. Next, bit line $B_{11}$ is driven with a 0 value, and word line $W_{10}$ is activated in order to perform the write operation to cell 403. Concurrently with the write operation at cell 403, word line $W_{21}$ is activated to read cell 401. The bit line short 450D, however, transfers the logic 0 value from bit line $B_{11}$ to bit line $B_{20}$. Because the word line of cell 401 is activated, cell 401 stores the logic 0 value from bit line $B_{20}$. When cell 401 is read to verify the logic 1 value two iterations later, the logic 0 value will be read back and the fault 450D discovered.

The procedures described above detect all possible interport faults between one read port (the test read port) and any other read port (including read/write ports and read-only ports) in the memory. In addition, the procedures detect all possible interport faults between one write port (the test write port) and any other read port. To detect faults between other ports, the test may be executed repeatedly, designating a different test port during each repetition. When repeating the test for different test ports, Pass 1 need only be executed for the first test port, and Pass 6 need only be executed for the final test port. To run the test on three different test ports, for example, the first port executes passes 1–5, the second test port executes passes 2–5, and the third test port executes passes 2–6. If desired, Passes 1 and 6 may be executed for any test port without departing from the principles of this disclosure. Omitting passes 1 and 6, however, will expedite the test, thus reducing test time.

To test for faults between every possible combination of ports, the number of executions depends on the types of ports in the memory. If the read/write ports access the same bit lines to read and to write, then using "$P_{RO}$" to represent the number of read only ports, "$P_{WO}$" to represent the number of write only ports, and "$P_{RW}$" to represent the number of read/write ports (i.e., the number of ports in which read and write operations occur on the same bitlines), expression 1, below, represents the number of executions to detect faults between all combinations of ports:

$$executions = \max\left\{\frac{P_{RW} + R_{WO} + P_{RO} - 1}{2}, P_{RO} - 1, P_{WO}\right\} \quad (1)$$

where max {argument 1, argument 2, argument 3} returns the maximum of the three arguments.

Any read/write port which uses different bit lines to read and to write should be tested twice: once for the read bit lines and once for the write bit lines. Accordingly, expression (2) gives the number of executions for detecting faults between all combinations of ports if the read/write ports do not share bit lines:

$$executions = \max\{P_{RW} + P_{RO} - 1, P_{RW} + P_{WO}\} \quad (2)$$

Accordingly, the read interport test described above is capable of detecting faults between a read/write port (or a combination of a read port and a write port) and various other types of ports, including read-only ports, read/write ports, and write-only ports. All possible types of faults are detected, including OR-type and AND-type faults, word line faults between row, word line faults at the same row, bit line faults between columns, bit line faults at the same column, and other faults, such as cell faults. Further, the test procedure covers every address of the array, no matter how the array is configured, requiring only the same number of operations as the March C Algorithm. Note that the word lines and bit lines may be rearranged in alternate configurations. The word lines in FIGS. 4A–H, for instance, correspond to a conventional $A_{WL}$-$B_{WL}$-$A_{WL}$-$B_{WL}$ arrangement, and the bit lines correspond to a conventional $A_{BL}$-$B_{BL}$-$A_{BL}$-$B_{BL}$ arrangement. Other acceptable arrangements include $B_{WL}$-$A_{WL}$-$B_{WL}$-$A_{WL}$ and $B_{BL}$-$A_{BL}$-$B_{BL}$-$A_{BL}$ arrangements.

Note that Passes 1–6 of the read interport test may be implemented in a variety of different orders. Passes 4–5 may occur in place of Passes 2–3, for example, and vice versa. Further note that, although a preferred embodiment envisions implementing the concurrent read operations two cells ahead or behind the main read and write operations, the concurrent read operations may occur at any desired address offset from the cell under test, without departing from the principles of this disclosure. In addition, the test may be executed any number of times, over any desired range of cells and through any desired ports, without departing from the principles of this disclosure. In particular, interport faults are unlikely to occur between ports which are not located adjacently. Thus, the concurrent operations may be omitted for ports which are not contiguous, or for any other reason.

In accordance with a preferred embodiment, a write interport test is disclosed for detecting faults between two write ports. The write interport test comprises four passes through the array. Passes 1 and 3 each traverse the array from address 0 to address N−1 and include two test operations: a test write operation followed by a test read operation. The write operations may utilize any desired test pattern, although a preferred embodiment envisions an initial test pattern with "solid" data background of all 0's. During each write operation, a concurrent write operation accesses a different cell through a different port, in order to provoke possible cell faults between the test port and the concurrent port. The concurrent write operation preferably accesses the cell two addresses behind the test address and writes a data value that is the complement of the value written on the test port. The concurrent write, however, does not occur during the first two test iterations.

Each read operation in Passes 1 and 3 preferably accesses the cell that is one address behind the test address, to verify the data that was written during the previous iteration. The test iteration for the first address, however, does not require a read operation, and none of the read operations requires a concurrent operation. Passes 2 and 4 comprise reading the array to verify the data that was written during Passes 1 and 3, respectively, and can traverse the array in any desired manner. In a preferred embodiment, Passes 2 and 4 march across the array from address 0 to address N−1. Note that the final two iterations of Passes 2 and 4, at addresses N−2 and N−1, read the complement of the data value read from addresses 0 to N−3. Table VII summarizes the operations of the write interport test procedure, including the preferred cell addressing order, the first and second operations during each test iteration, and the concurrent operation that occurs during the first operation of Passes 1 and 3.

TABLE VII

| | | | | |
|---|---|---|---|---|
| | | Write Interport Test. | | |
| Pass | Address Range | Test Operation 1 | Test Operation 2 | Concurrent Operation (During Test Operation 1) |
| 1 | 0 to N−1 | Write 0 to Test Address | Read 0 from Test Address − 1 | Write 1 to Test Address − 2 |
| 2 | 0 to N−3 | Read 1 from Test Address | None | None |
| | N−2 to N−1 | Read 0 from Test Address | None | None |

TABLE VII-continued

Write Interport Test.

| Pass | Address Range | Test Operation 1 | Test Operation 2 | Concurrent Operation (During Test Operation 1) |
|---|---|---|---|---|
| 3 | 0 to N-1 | Write 1 to Test Address | Read 1 from Test Address – 1 | Write 0 to Test Address - 2 |
| 4 | 0 to N-3 | Read 0 from Test Address | None | None |
|   | N-2 to N-1 | Read 1 from Test Address | None | None |

FIGS. 5A–B illustrate flow charts of the write interport test summarized in Table VII. As described above, the write interport test occurs between a first write port (or the "test" port) and a second write port (or the "concurrent" port). Accordingly, the write interport test of FIGS. 5A–B will detect any interport faults which exist between the test write port and the concurrent write port. Referring initially to FIG. 5A, the test address (ADDR) is initialized to zero in block 500. Next, a write operation is performed through the test port in block 504, storing a logic 0 value into the cell at the current test address. If the current test address is greater than 2 (block 508), then a concurrent write operation is executed two cells behind the test address, through the concurrent port (block 512). Because the cells are tested consecutively from the lowest address to the highest address, two cells behind the test address corresponds to the test address –2.

If the test address is greater than 0, then a read operation is performed in block 520 at the cell that is between the test address and the concurrent address, or the cell at test address –1. Because the cell at address –1 received a logic 0 value during the write operation of the previous iteration, the read operation should return a 0 value. If the cell produces a logic 1 value in response to the read operation, then a fault is declared in block 522. As shown in block 524, if the test address reaches N–1 after executing blocks 500–522, then the test proceeds to Pass 2 (block 530). Otherwise, the test address is incremented (block 528), and control returns to blocks 504 and 508.

Block 530 begins Pass 2 by resetting the test address to 0. Next, in block 532, the cell at the test address is read to verify the logic 1 value that was written by a concurrent operation during Pass 1. The read operation of block 532 preferably is executed through the test port, although any desired write port will suffice. As shown in block 534, if the test cell returns a logic 0 value in response to the read operation in block 532, then a fault is declared. Blocks 530–534 are repeated, incrementing the address in block 538 following each iteration, until the value of cell N–3 has been verified (block 536).

Next, because the concurrent operations of Pass 1 do not occur at addresses N–2 and N–1, blocks 540–546 read cells N–2 and N–1 to check for logic 1 values which were written by the test operations of block 504 during Pass 1. In block 540, cell N–2 is read to check for a logic 0 value. If a logic 1 value is found instead (block 542), then a fault is detected. Next, cell N–1 is read (block 544), and an fault is declared if a logic 1 value is found instead of the expected logic 0 value (block 546). Following block 546, the write interport test proceeds to Pass 3, as illustrated in FIG. 5B.

FIG. 5B illustrates the operations for Passes 3–4 of the write interport test. Note that Passes 3–4 are substantially the same as Passes 1–2, but the data values are complemented. Beginning Pass 3 at block 552, the test address resets to 0. Next, in block 556, the test writes a logic 1 value through the test port to the test address. Concurrently, the cell two addresses behind the test cell receives a logic 0 value in block 564, as long as the test address is greater than or equal to 2 (block 560). Following the concurrent write operations of block 556 and 564, the tests reads the cell through the test port at address –1, as long as the test address is greater than or equal to 1. Because of the logic 1 value stored through the test port during the previous iteration, the cell at address –1 should return a logic 1 value in response to the read operation. If the cell returns a logic 0 value instead, then a fault is declared (block 574). The write interport test then repeats blocks 556–574, incrementing the test address after each iteration (block 582), until the test address reaches N–1, in block 578. After reaching test address N–1, the test proceeds to Pass 4, beginning with block 584.

Beginning with block 584, the test address is reset to zero, and the cell located at the test address is read in block 586 to verify the logic 0 value which was written by the concurrent operation of block 564, during Pass 3. If the read operation produces a logic 1 value instead of the expected logic 0, then a fault is detected (block 588). Next, unless the test address equals N–3 (block 590), the test address is incremented in block 592, and blocks 586–590 repeat. If the address equals N–3 during block 590, however, then the test advances to block 594. Because Pass 3 did not execute concurrent operations at the final two cell addresses N–2 and N–1, cells N–2 and N–1 should hold the logic 1 values written through the test port by the test operations of block 556, during Pass 3. Accordingly, block 594 reads cell N–2 to verify the logic 1 value. If a logic 0 value is found instead (block 595), then a fault is declared. Similarly, block 598 reads cell N–1 to verify the logic 1 value. If the read operation of cell N–1 returns a logic 0 value instead (block 599), then a fault is declared. The write interport test ends after block 599.

If an interport fault exists between the test port and the concurrent port at one or more cells near the test address, then executing the test write of block 504 and the concurrent write of block 512 may cause an error in one of the write operations. A bit line short between the test port and the concurrent port, for example, may cause the logic 0 of the test write to override the logic 1 of the concurrent write, storing a logic 0 into both cells (an AND-type fault). Alternatively, the logic 1 value of the concurrent write may override the logic 0 value of the test write, storing a logic 1 into both cells (an OR-type fault). Word line shorts also may cause faults during the concurrent write operations. If the word line of the test cell is shorted with the word line at the cell that is between the test address and the concurrent address, then the write operation will store a logic 0 value in the cell between the test address and the concurrent address through the test port.

FIG. 6A depicts an exemplary two port cell array undergoing Pass 1 of the write interport test, in which port 1 represents the test port. Thus, port 2 handles the concurrent write operations. The cell array includes cells 400, 401, and 402, as in FIG. 4A, each cell coupled to bit lines $B_1$ (port 1) and $B_2$ (port 2). As shown, cell 400 includes two write ports with word lines $W_{10}$ (write port 1) and $W_{20}$ (write port 2). Similarly, cell 401 couples to word lines $W_{11}$ (write port 1) and $W_{21}$ (write port 2), and cell 402 receives word lines $W_{12}$ (write port 1) and $W_{22}$ (write port 2). In addition, a word line short 650A exists between the word lines $W_{12}$ and $W_{22}$ at cell 402. During Pass 1, a logic 0 value is written to the cell under test through port 1 (i.e. block 504 of FIG. 5A), and a logic 1 value is written to the cell that is two addresses behind the cell under test, through port 2 (i.e., block 512 of FIG. 5A). Since Pass 1 traverses the cell array from the lowest address to the highest address in the array, the concurrent write operation on port 2 occurs two addresses below the test write operation on port 1. As shown in FIG. 6A, the cell under test is cell 402, and thus the concurrent write occurs at cell 400.

The test write is effected on port 1 by driving the port 1 bit line with a logic 0 and then activating word line $W_{12}$ to cause cell 402 to accept the 0 value from the bit line $B_1$. Concurrently, the bit line on port 2 is driven with a logic 1 value, and word line $W_{20}$ is activated to cause cell 400 to accept the logic 1 value from the bit line $B_2$. If the short 650A behaves as an OR-type short, however, word line $W_{22}$ is inadvertently activated, causing both bit lines $B_1$ and $B_2$ to drive the memory cell 402. If the logic 1 driven onto bit line $B_2$ is stronger than the logic 0 on bit line $B_1$, then cell 402 will receive a logic 1 value, instead of the intended logic 0 value. During the next iteration, when the test cell is at address 403 (not shown), the read operation (i.e., block 520 of FIG. 5A) will discover the errant logic 1 in cell 402. If the short 650A behaves as an AND-type short, however, then the deactivated word line W22 will prevent word line W12 from activating, and the write operation at cell 402 will fail. If cell 402 holds a logic 1 value prior to Pass 1, then the logic 1 value will be detected during the next iteration, pointing out the write failure during the test of cell 402. If cell 402 holds a logic 0 value prior to Pass 1, then the next iteration will read logic 0 from cell 402, and the fault will go undetected. Pass 3, however, will detect the fault, since the write 1 operation at cell 402 will fail, and the subsequent read operation will detect the write failure.

FIG. 6B again illustrates cells 400–402, except with a word line fault between port 1 of cell 401 (i.e., word line $W_{21}$) and port 1 of cell 402 (i.e., word line $W_{12}$). As in the previous example, the cell array is undergoing Pass 1 of the write interport test, in which the current test address is cell 402, and the test port is port 1. To perform the write operation on the test port, bit line $B_1$ is driven with a logic 0 value, and word line $W_{12}$ is activated. Concurrently, bit line $B_2$ is charged with a logic 1 value, and word line $W_{20}$ is activated. In response to activating the word lines $W_{12}$ and $W_{20}$, cells 402 and 400 accept the values from bit lines $B_1$ and $B_2$, respectively. Because of the short between word lines $W_{21}$ and $W_{12}$, however, word line $W_{21}$ is also activated if the short 650B behaves as an OR-type short, causing cell 401 to accept the logic 1 value from bit line $B_2$. As described above, the read operation that follows the write operations in Pass 1 expects to find a logic 0 value in cell 401. Because cell 401 contains a logic 1 value after the write operation, the fault is detected. If the short 650B behaves as an AND-type short, then the write operation at cell 402 will fail, since word line $W_{21}$ is not activated concurrently with word line $W_{12}$. For the same reason, the concurrent write operation two iterations later will fail, so that the value of cell 401 remains intact. Subsequently, the write operation of cell 401 in Pass 3 will fail and will be detected by the read operation of the following iteration.

FIG. 6C illustrates another example of cells 400–402 with a bit line fault 650C at the same column, shown coupling bit lines $B_1$ and $B_2$. Because Pass 1 involves writing a 0 value over the test port (i.e., port 1) and a 1 value over the concurrent write port (i.e., port 2), bit line $B_1$ is driven with a logic 0, and bit line $B_1$ is charged with a logic 1 value. When Pass 1 of the test reaches test address 402, word line $W_{12}$ is activated to execute the test write to cell 402 through port 1, and word line $W_{20}$ is activated to perform the concurrent write at cell 400 through port 2. Because the bit lines $B_1$ and $B_2$ are shorted, however, both cells 400 and 402 are driven with conflicting values. If the short 650C behaves as an OR-type short, then both cells will store a logic 1 value. Accordingly, the read operation of cell 402 during the next iteration will discover the logic 1 value and declare a fault. If the short 650C behaves as an AND-type short, then both cells will store a logic 0 value. An AND-type short, however, will be discovered in Pass 2, since cell 400 will store a logic 0 value and the read operation checks for a logic 1.

FIG. 6D again illustrates the array of FIG. 4D, with a short 650D between bit lines at different cell columns. As shown, the short 650D couples bit lines $B_{20}$ (port 1, first column) with bit line $B_{11}$ (port 1, second column). The cell array is undergoing Pass 1 of the write interport test, in which cell 403 represents the cell under test. Thus, cell 401, which is two addresses behind cell 403 as the test traverses the memory array, receives the concurrent write operation. The test write operation on port 1 is accomplished by placing a logic 0 value onto bit line $B_{11}$ and activating word line $W_{10}$, and the concurrent write operation on port 2 is achieved by charging bit line $B_{20}$ to a logic 1 and activating word line $W_{21}$. Because the bit line short 650D couples bit lines $B_{11}$ and $B_{20}$, however, cells 401 and 403 receive conflicting values. If the short 650D behaves as an OR-type short, then cells 401 and 403 will store a logic 1 value. Accordingly, the logic 1 value will be detected during the subsequent iteration, when cell 403 is read to check for a logic 0 value. If the short 650D behaves as an AND-type short, however, then cells 401 and 403 will store a logic 0, and Pass 2 will detect the fault during the read operation of cell 401.

The write interport test thus detects all possible interport faults between a first write port (the port under test) and any other second write port in the memory. To detect faults between other write ports, such as between a third write port and the first write port, the test may be executed repeatedly for each pair of ports. Thus, expression (3) provides the number of executions to test for faults between write ports (including write-only ports and including read/write ports that use a separate set of bit lines for read operations and write operations):

$$\text{executions} = \tfrac{1}{2}(P_{RW}+P_{WO})(P_{RW}+P_{WO}-1) \qquad (3)$$

Note that expression (3) does not depend on the number of read-only ports, since the write interport test focuses on write operations. Similarly, expression (3) does not depend on the number of read/write ports in which the read operations occur over the same bit lines as the write operations.

Accordingly, the write interport test described above is capable of detecting faults between write ports, including write-only ports and read/write ports in which the read operations and write operations occur over separate bit lines. All possible types of faults are detected through a series of 4 passes, including OR-type and AND-type faults, word line faults between row, word line faults at the same row, bit line faults between columns, bit line faults at the same column, and other faults, such as cell faults. Further, the test procedure covers every address of the array, no matter how the array is configured, requiring only 6N operations, where N represents the number of memory cells. Note that the test also could address the cells word-wise instead of bit-wise, in which case N would represent the number of memory words.

Note that Passes 1–4 of the write interport test may be implemented in a variety of different orders. Passes 1 and 3 may be interchanged, for example, along with Passes 2 and 4. Further note that, although a preferred embodiment envisions implementing the concurrent read operations two cells ahead or behind the test operations, the concurrent read operations may occur at any desired address offset from the cell under test, without departing from the principles of this disclosure. In addition, the test may be executed any number of times, over any desired range of cells and through any desired ports, without departing from the principles of this disclosure. Also note that the word lines and bit lines may be configured according to other arrangements, such as $B_{WL}$-$A_{WL}$-$B_{WL}$-$A_{WL}$ (word line) and $B_{BL}$-$A_{BL}$-$B_{BL}$-$A_{BL}$ (bit line) arrangements.

Now referring to FIG. 7, a multiport memory testing circuit is shown coupled to an exemplary multiport memory array 700. The multiport memory testing circuit includes a control logic device 724 coupled to a variety of components, including a test address register 728, a data register 744, a comparator 752, an address multiplexer (or "mux") 720, and a data multiplexer (or "mux") 764. The testing circuit preferably is manufactured integrally with a memory array and configured to implement a Built In Self Test (BIST) of the memory. The memory testing circuit may comprise an external hardware device that is connectable to a memory array, however, including both dedicated and programmable machines. A programmable computer, for instance, may be loaded with a software program to provide the features of the memory testing circuit. Alternatively, a hardwired tester may be arranged to accommodate a memory chip and perform the functions described herein.

As shown in FIG. 7, the memory array 700 generally includes an array of memory cells 708 coupled to a bank of address decoders 704 and to a read/write logic circuit 712. The address decoders 704 generally receive codes corresponding to individual cells. In response, the address decoders 704 assert the word lines corresponding to the addressed cells. To facilitate memory accesses on multiple ports at the same time, the address decoders 704 are capable of asserting a different word line on each port simultaneously. The read/write logic 712 drives the cell bit lines during memory write operations and/or detects the values of cell bit lines during memory read operations. The read/write logic 712 is capable of reading and writing through multiple ports simultaneously. In a preferred embodiment, the memory array 700 comprises a static random access memory array with at least two ports. The array 700 may feature any desired types and combination of ports (not specifically shown), including one or more read-only ports, one or more write-only ports, and/or one or more read/write ports.

A memory address bus 768 couples to the memory array 700 for providing memory addresses corresponding to particular cells during memory operations. The memory address bus 768 preferably includes a distinct set of address lines for each memory port so that each port operates independently of the other ports. Similarly, a memory data bus 772 couples to the memory array 700 for carrying data to and from the memory cells 708. The memory data bus 772 preferably includes a distinct set of data lines for each port.

Referring again to the memory tester of FIG. 7, the control logic 724 executes general control operations, including loading cell address values into the test address register 728, loading and unloading the data register 744, monitoring the state of the comparator 752, and selecting the states of the multiplexers 720 and 764. The test address register 728 stores a plurality of cell addresses, each address corresponding to a different memory port. The test address register 728 drives the test address port 732 with one of the address values and drives the concurrent address port 740 with the remaining values. The primary address bus 732 preferably corresponds to one port of the memory 700, and thus provides a single memory address. In a preferred embodiment, the port corresponding to the test address bus 732 may be selected by the control logic 724. In additiori to cell address signals, the primary address bus 732 also includes any control signals necessary for operating the memory, including a read/write signal to indicate whether a particular cycle represents a read or write operation. The secondary address bus 740 preferably comprises address lines for a plurality of memory ports. Specifically, the secondary address bus 740 provides separate address signals for all ports other than the port corresponding to the primary address bus 732. In addition to cell address signals, the secondary address bus 740 includes any control signals necessary for operating the memory ports, including read/write signals to indicate whether a particular cycle is a read or write operation.

Thus, the address multiplexer 720 receives memory addresses from the test address register 728 on a first port, via a primary address bus 732, and on all other memory ports, via a secondary address bus 740. The address multiplexer 720 further couples to an external address bus 716, which receives memory addresses from any suitable external circuit (not shown), such as a processor. In addition to cell address signals, the external address bus 716 also includes any control signals necessary for operating the memory, including read/write signals which indicate whether a particular cycle is a read or write operation. The control logic 724 provides a test enable signal to the address multiplexer 720, to select either the external address bus 716 (if the test enable line is deasserted) or the primary and secondary address signals (if the test enable line is asserted). If the external address bus.716 is selected, then the address multiplexer 720 routes the signals from the external address bus 716 to the memory address bus 768 to control memory addressing. If the test enable line is asserted, however, then the primary address bus 732 and secondary address bus 740 drive the memory address bus 716 via the address multiplexer 720.

The data register 744 comprises a multiport data storage unit capable of storing read data received from the memory 700 as well as write data in route to memory. Thus, the data register 744 includes one or more storage locations corresponding to each memory port. The data multiplexer 764 receives the external data bus signals 760 and the signals from a test data bus 756, both of which couple to the data register 756. Accordingly, the data multiplexer 764 couples the memory data bus 772 to the test data bus 756, if the control logic 724 asserts the test enable signal. If the test enable signal is deasserted, the data multiplexer 764 couples the memory data bus 772 to the external data bus 760 instead. Thus, the control logic 724 couples the memory address and data signals to the external address and data bus (which may couple to input/output terminals) to permit external control if the test enable line is deasserted, or couples the memory address and data signals to the internal address signals (i.e., the primary address, secondary address, and test data buses) if the test enable signal is asserted, thus permitting uninterrupted memory control by the control logic 724.

In a preferred embodiment, the comparator 752 provides a fault detect signal to the control logic 724, and the control logic 724 provides a compare port signal to the data register 744. The control logic 724 further provides compare data signal to the comparator 752. The compare port signal identifies a port in the memory 700, and the data register 744 routes the data signals associated with the identified port to the comparator 752. The comparator 752 asserts the fault detect signal to the control logic 724 if the compare data signals do not match the value of the data signals received by the comparator 752 from the data register 744.

During normal memory operation, the control logic 724 deasserts the test enable signal. Accordingly, the address multiplexer 720 and the data multiplexer 764 route the address, control, and data signals to the memory 700. To execute an interport test, including the write interport test or the read interport test, the control logic asserts the test enable signal. In response, the data multiplexer 764 couples the memory data bus 772 to the test data bus 756, which is driven by the data register 744 under control of the control logic 724, and the address multiplexer 720 couples the memory address bus 768 to the primary address bus 732 and to the secondary address bus 740.

To implement the read interport test, the control logic 724 determines which port represents the test port. Accordingly, the address signals corresponding to the test port are chosen as the primary address bus 732, and the remaining address signals are chosen as the secondary address bus 740. To implement Pass 1 of the read interport test, the control logic 724 stores a logic 0 value into the data register 744 in the data location corresponding to the test port. Next, the control logic 724 addresses each memory cell in the array 708 by incrementing an address value in the test address register 728, at the address location corresponding to the test port. Accordingly, the address multiplexer 720 carries the test addresses from the test address register 728, via the primary address bus 732, to the memory address bus 768. The memory address bus 768 drives the address decoders 704, which assert the word lines associated with each test cell. At the same time, the data register 744 drives the logic 0 value onto the test data bus 756, through the multiplexer 764, and onto the memory data bus 722. The memory data bus 722 thus provides the logic 0 value to the cell array 708 as each cell is accessed, completing the write operation.

As explained above, Passes 2–5 involve concurrent operations that occur over the test port and through a plurality of other ports at the same time. Because the concurrent read operations in Passes 2–5 occur at different addresses than the test operations (i.e., the test read operation and the subsequent test write operation), the control logic 724 stores the value of each test operation into the test address register 728 location corresponding to the test address bus 732, and the concurrent address is stored into the test address register 728 locations corresponding to the other ports, which drive the concurrent address bus 740. If the test is passing through the memory from address 0 to address N−1, then the concurrent address bus 740 will be two addresses behind the test address bus 732, which means that the concurrent address bus .740 will have a value that is two addresses lower than the value of the test address bus 732. Otherwise, if the test is passing through the memory from address N−1 to address 0, then two addresses behind the test address bus 732 means that the concurrent address bus 740 will have a value that is two addresses higher than the value of the test address bus 732. The control logic 724 supplies the comparator 752, via the compare data signal, with the data values that are expected to be read during each test read operation. The control logic 724 also indicates to the data register 744, via the compare port signal, which port is the test port. During a write operation, the control logic 724 supplies the data register 744 with the data to be written.

To implement the test read operation and concurrent read operation of Passes 2–5, the control logic 724 first drives the compare data signal with the expected value of the read operation. For Passes 2 and 4, the test read is expected to return a logic 0 value, so the compare data signal is deasserted. During Passes 3 and 5, the test read is expected to return a logic 1 value, so the compare data signal is asserted. Next, the control logic 724 loads the test address register 728 with the test address, which is driven onto the test address bus 732 through the test port, and the concurrent address, which is driven onto the concurrent address bus 740 through all other ports. Upon receiving the test and concurrent addresses, which also include control signals which initiate the read command, the memory device 700 performs one read operation on the test port, at the address specified by the test address bus 732, and another read operation on all other ports, at the address specified by the concurrent address bus 740. The memory data bus 772 carries the read result to the data register 744, via the test data bus 756. The data register 744 then provides the comparator 752 with the value received through the test port. If the value received through the test port does not match the state of the compare data signal, indicating that a fault has occurred, then the comparator 752 asserts the fault detect signal to the control logic 724. Otherwise, the fault detect signal remains deasserted. The control logic 724 may, if desired, count each time that the fault detect signal is asserted, to determine the number of memory faults.

Following the test and concurrent read operations, Passes 2–5 implement a test write operation, along with a second concurrent read operation. The control logic 724 stores the value of the test write operation into the data register 744, in the location corresponding to the test port. In response, the data register 744 drives the test data bus 756 with the write value, which supplies the value to the memory 700 via the memory data bus 772. The control logic 724 also supplies the test address register 728 with the values for the write and read operation. The write operation, which occurs on the test port, addresses the same cell as the test read operation. The read operation that occurs concurrently with the write operation, however, occurs two addresses ahead of the write operation. Thus, the control logic 724 loads the concurrent address register 728 with the value of the write address +2 for the concurrent address bus 740, if the test is iterating from address 0 to address N−1, or with the value of the write address −2, if the test is iterating from address N−1 to address 0. When the control logic 724 drives the appropriate control signals (via the address buses) to initiate the memory transactions, the memory 700 performs the test write and concurrent read operations. Accordingly, the memory array 700 accepts the write value from the memory data bus 772 through the test port.

During Pass 6, which reads the value of each cell in the memory 700, the control logic 724 loads the test address register 728 with each memory address and initiates the read operation. The read operation preferably occurs through the test port, and thus over the test address bus 732, although any port is acceptable. During the read operations, the control logic 724 supplies the expected value of the read operation to the comparator 752, via the compare data signal. Because the expected data value during Pass 6 is logic 0, the control logic 724 deasserts the compare data signal. The data register 744 routes the result of each read operation to the comparator 752, which determines if the result matches the expected value. If the result matches, the comparator 752 keeps the fault detect signal deasserted. If the result does not match, indicating that a fault occurred, then the comparator 752 asserts the fault detect signal.

The read and write operations of the write interport test utilize substantially similar operations to the read and write operations of the read interport test. The control logic 724 determines which port represents the test port and loads the corresponding locations in the test address register 728 with the test addresses. The control logic 728 also loads the test address register 728 with the addresses corresponding to the concurrent write operations. Thus, the test address register 728 drives each test address onto the primary address bus 732, and drives each concurrent address onto the secondary address bus 740. Because the concurrent write operations occur two addresses behind the test write operations, the secondary address bus 740 carries a value that is two addresses lower than the address of the primary address bus 732 during write operations. The control logic 724 also loads the test address register 728 with the read address values during each read operation.

The control logic 724 also loads the data register 744 with the write values for both the test port and the concurrent port. Accordingly, the memory 700 receives the write values over the memory data bus, via the test data bus 756, which is driven by the data register 744. During each read operation, the control logic 724 loads the comparator with the expected read value and identifies to the data register 744 the port that is executing the read operation. When the read operation completes, the data register 744 supplies the read value to the comparator 752, which asserts the fault detect line if the read operation value does not match the value of the compare data line.

One alternative embodiment of the read interport test implements a reduced number of test passes in order to shorten the overall testing time. First, the test implements Passes 1–3 on a first test port. After Passes 1–3 finish on the first test port, Passes 4–6 are then run on another test port. The read interport test then runs either Passes 1–3 or Passes 4–6, alternating for each test port, until the P–1$^{th}$ test port has been tested, where P represents the number of possible test ports. Note that the P$^{th}$ test port does not have to be tested, since the first P–1 tests run concurrent operations over port P. If P is an odd number, then the P–1$^{th}$ test will implement Passes 4–6, and the read interport test will end. Table VIII-A summarizes the first alternative embodiment of the read interport test, for odd values of P.

TABLE VIII-A

Alternative Read Interport Test for Odd Values of P.

| Test Port | Passes Executed |
|---|---|
| 1 | 1–3 |
| 2 | 4–6 |
| . . . | . . . |
| Odd numbered ports | 1–3 |
| Even-numbered ports | 4–6 |
| . . . | . . . |
| P-2 | 1–3 |
| P-1 | 4–6 |

If P is an even number, however, then the test on port P–2 will implement Passes 4–6. Accordingly, the test on port P–1 preferably executes all six passes. Thus, port P–1 preferably is chosen as the test most likely to possess interport faults. Table VIII-B summarizes the first alternative embodiment of the read interport test, for even values of P.

TABLE VIII-B

Alternative Read Interport Test for Even Values of P.

| Test Port | Passes Executed |
|---|---|
| 1 | 1–3 |
| 2 | 4–6 |
| . . . | . . . |
| Odd numbered ports | 1–3 |
| Even-numbered ports | 4–6 |
| . . . | . . . |
| P-3 | 1–3 |
| P-2 | 4–6 |
| P-1 | 1–6 |

FIG. 8 illustrates a 4×4 memory array addressed according to column fast scheme, in accordance with a second alternative embodiment of the read and write interport tests. The column fast scheme addresses the cells consecutively across each row, in contrast with the row fast scheme of the previous embodiments, in which the addresses increment consecutively going down each column. Cells 800, 801, 802, and 803 comprise row 0 of the array, for example, while cells 804, 805, 806, and 807 comprise row 1 of the array. Similarly, cells 808, 809, 810, and 811 comprise row 2 of the array, while cells 812, 813, 814, and 815 comprise row 3. As in previous embodiments of the read and write interport tests, the cells are addressed consecutively, either in the forward direction (from 800 to 815) or in the reverse direction (from 815 to 800). Thus, the memory tests progress from left to right, or from right to left, across the rows. After reaching the end of a row, the test address moves to a cell on the next row. Note that column fast addressing scheme may be used for the write interport test and/or the read interport test, as described in the preferred embodiments, as well as any other alternative embodiment described herein.

Under the column fast addressing scheme, it is preferred that the concurrent operations occur in the same column as the test cell, at some number of cells above or below the test cell. Accordingly, the concurrent operations do not necessarily occur two cell addresses ahead or behind the test cell. Instead, the concurrent operations occur 2C cell addresses ahead or behind the test cell, where C represents the number of columns in the array. Note that in an array with only one column, the column fast scheme reduces to the row fast scheme.

Table IX summarizes the addressing scheme for the read interport test, using the column fast addressing technique. Note that the operations for the read interport test are the same for the column fast scheme as for the row fast scheme. Pass 1 comprises initializing the array and can address the cells in any desired order. Passes 2–3 preferably address the cells from 0 to N–1, while Passes 4–5 preferably address the cells in reverse order, from N–1 to 0. Passes 2–5 each comprise a read operation on the test port followed by a write operation on the test port. Concurrent read operations occur on all other ports during the test read and during the test write. The first concurrent operation during Passes 2–3, however, occurs two rows above the test address (i.e., at test address –2C), and the second concurrent operation during Passes 2–3 occurs two rows below the test address (i.e., at test address +2C). Because Passes 4–5 address the cells in reverse order, the first concurrent operation occurs two rows below the test address (i.e., at test address +2C), while the second concurrent operation occurs two rows above the test address. Pass 6 preferably addresses the cells consecutively to verify the data written during Pass 5, although Pass 6 may address the array in any desired sequence.

TABLE IX

Alternative Concurrent Addressing Scheme For Read Interport Test.

| Pass | First Address Range | Concurrent Operation (During Test Read) | Second Concurrent Operation (During Test Write) |
|---|---|---|---|
| 1 | 0 to N-1 | None | None |
| 2 | 0 to N-1 | Read Test Address − 2C | Read Test Address + 2C |
| 3 | 0 to N-1 | Read Test Address − 2C | Read Test Address + 2C |
| 4 | N-1 to 0 | Read Test Address + 2C | Read Test Address − 2C |
| 5 | N-1 to 0 | Read Test Address + 2C | Read Test Address − 2C |
| 6 | 0 to N-1 | None | None |

Note that the concurrent operations only occur if a cell exists two rows above (or below) the test address. Referring to the exemplary array of FIG. 8, the first concurrent operation of Passes 2–3, which reads the cell two rows above the test cell, does not occur when the test address is lower than 808, since there are no cells which are two rows above cells 800–807. The first concurrent operation only takes place when testing cells 808–815 through the test port. When testing cell 808, for example, the first concurrent read operation occurs at cell 800. Similarly, concurrent operations occur at cell 801 (when testing cell 809), cell 802 (when testing cell 810), cell 803 (when testing cell 811), cell 804 (when testing cell 812), cell 805 (when testing cell 813), cell 806 (when testing cell 814), and cell 807 (when testing cell 815). For similar reasons, the second concurrent operation is omitted during Passes 4–5, when testing cells 808–815.

Similarly, the second concurrent operation of Passes 2–3, which is executed two rows below the test cell, only occurs during the first two iterations of the test, in the array shown in FIG. 8. When testing cell 800, for example, the second concurrent read operation occurs at cell 808. The second concurrent read operation also occurs at cell 809 (when testing cell 801), cell 810 (when testing cell 802), cell 811 (when testing cell 803), cell 812 (when testing cell 804), cell 813 (when testing cell 805), cell 814 (when testing cell 806), or cell 815 (when testing cell 807). The second concurrent operation does not occur during Passes 2–3 when testing cells 808–815, since there are no cells two rows below cells 808–815. Similarly, the first concurrent operation is omitted during Passes 4–5, when testing cells 808–815.

Table X summarizes the column fast technique for the write interport test. Each iteration of test operation 2 occurs one row above the test cell, while each iteration of the concurrent operation occurs two rows above the test cell. Still referring to the example array of FIG. 8, neither the second test operation nor the concurrent operation is executed while testing cells 800–803. When testing cells 804–807, the second test operations occur at cells 800–803, respectively, but no concurrent operations are executed, since there are no cells two rows below cell 804–807. When testing cells 808–811, the second test operations occur at cells 804–807, respectively, and concurrent operations are executed at cells 800–803, respectively. Similarly, when testing cells 812–815, the second test operations are executed at cells 808–811, respectively, and concurrent operations occur at cells 804–807, respectively.

TABLE X

Alternative Concurrent Addressing Scheme For Write Interport Test.

| Pass | Address Range | Test Operation 1 | Test Operation 2 | Concurrent Operation (During Test Operation 1) |
|---|---|---|---|---|
| 1 | 0 to N-1 | Write 0 to Test Address | Read 0 from Test Address − C | Write 1 to Test Address − 2C |
| 2 | 0 to N-2C-1 | Read 1 from Test Address | None | None |
|  | N-2C-1 to N-1 | Read 0 from Test Address | None | None |
| 3 | 0 to N-1 | Write 1 to Test Address | Read 1 from Test Address − C | Write 0 to Test Address − 2C |
| 4 | 0 to N-2C-1 | Read 0 from Test Address | None | None |
|  | N-2C-1 to N-1 | Read 1 from Test Address | None | None |

Numerous variations and modifications will become apparent to those skilled in the art once the above disclosure is fully appreciated. It is intended that the following claims be interpreted to embrace all such variations and modifications.

We claim:

1. A method of testing for interport faults in a multiport memory device, comprising:
   writing a predetermined data pattern into a plurality of memory cells;
   consecutively addressing each cell through a first port;
   performing a first memory operation at each address through said first port;
   concurrently with the first memory operation, performing a second memory operation through a second port, wherein the second memory operation occurs at a fixed number of cells away from the address of the first memory operation; and
   verifying the result of each first memory operation.

2. The method of claim 1, wherein the first and second memory operations comprise read operations.

3. The method of claim 2, including following each first read operation with a write operation on said first port, wherein each write operation occurs at the same address as the preceding first read operation.

4. The method of claim 3, wherein each write operation stores the complement of the value returned by the first read operation.

5. The method of claim 4, including performing a third read operation concurrently with the write operation, wherein the third read operation occurs at least two cells behind the write operation.

6. The method of claim 5, wherein the second memory operation occurs at least two cells behind the first memory operation.

7. The method of claim 6, including executing the third read operation through both the first port and the second port, concurrently with the write operation on the first port.

8. The method of claim 1, wherein the first memory operation comprises a write operation, and the second memory operation comprises a read operation.

9. The method of claim 8, wherein the read operation occurs at least two cells behind the write operation.

10. The method of claim 9, including executing the read operation through both the first port and the second port, concurrently with the write operation on the first port.

11. A method of checking for interport faults in a multi-port static random access memory device, comprising:
consecutively addressing a plurality of memory cells through a first port;
performing for each address two memory write operations in parallel, including a first write and a second write, wherein the first write occurs through said first port, and the second write occurs through a second port at a fixed number of cells consecutively behind the first write; and
verifying the result of the first write.

12. The method of claim 11, wherein the fixed number comprises at least two.

13. The method of claim 11, wherein the second write operation stores the complement of the data stored in the first write operation.

14. The method of claim 13, including performing a read operation one cell consecutively behind the first write operation, after executing each first write operation.

15. The method of claim 14, wherein verifying the result of the first write comprises reading the plurality of memory cells.

16. The method of claim 15, further comprising consecutively addressing the memory during two passes, including one pass from the lowest address to the highest address and another pass from the highest address to the lowest address, and implementing the first and second write operations during both passes, wherein the first write operation stores a logic 0 value during the first pass and a logic 1 value during the second pass.

17. The method of claim 16, including traversing the memory after each of the passes to verify the data values stored by the write operations.

18. A memory testing circuit capable of interfacing a multiport memory device, comprising:
a test address register configured to provide a first memory address to a first memory port;
a concurrent address register configured to provide a second memory address to a second memory port;
a data register configured to store data for memory read and write cycles on a plurality of memory ports; and
a control logic capable of executing memory operations over multiple ports concurrently through said test address register, said concurrent register, and said data register;
wherein said control logic is configured to consecutively access a plurality of memory addresses through said test address register to perform a first set of concurrent operations, including:
a first memory operation executed through said first port at a memory address defined by the value of said test address register; and
a second memory operation executed through said second port at a memory address defined by the value of said concurrent address register, wherein the second memory operation occurs concurrently with the first memory operation and at an address corresponding to a fixed number of cells consecutively behind the first memory operation.

19. The memory testing circuit of claim 18, wherein the first and second memory operations comprise read operations.

20. The memory testing circuit of claim 19, wherein said control logic is configured to perform a second set of concurrent operations following each of said first set of concurrent operations, comprising:
a third memory operation executed through said first port at the same address as the first memory operation; and
a fourth memory operation executed through said second port at an address corresponding to a fixed number of cells ahead of the third memory operation.

21. The memory testing circuit of claim 20, wherein the third memory operation comprises a write operation, and wherein the write operation writes the complement of the value returned by the first write operation.

22. The memory testing circuit of claim 21, wherein the fourth memory operation comprises a read operation.

23. The memory testing circuit of claim 22, wherein said control logic executes the fourth operation over a plurality of ports concurrently.

24. The memory testing circuit of claim 22, wherein said control logic executes the fourth operation over all ports concurrently.

25. The memory testing circuit of claim 24, wherein each second memory operation occurs two consecutively cells behind the first memory operation.

26. The memory testing circuit of claim 24, wherein each fourth memory operation occurs two cells consecutively ahead of the third memory operation.

27. The memory testing circuit of claim 18, wherein the first and second memory operations comprise write operations.

28. The memory testing circuit of claim 27, wherein the first write operation writes the complement of the second write operation.

29. The memory testing circuit of claim 28, wherein each second memory operation occurs two cells behind the first memory operation.

30. The memory testing circuit of claim 29, wherein said control logic executes a read operation following each first write operation, wherein said read operation occurs one cell behind the first write operation.

31. A multiport memory device, comprising:
an array of memory cells having multiple ports;
an input/output interface coupled to said array of memory cells, said interface including address and data signals;
a built in self test unit coupled to said array via said input/output interface and configured to check for interport faults in said array, said built in self test unit comprising:
a first address register that provides a first address value to said interface;

a second address register that provides a second address value to said interface;

a data register that stores data for read and write operations in said array; and a control logic device that controls the operation of said first address register, said second address register, and said data register;

wherein said built in self test circuit performs a series of test memory operations at each of a plurality of addresses in said memory array through a first of said multiple ports;

wherein said built in self test circuit performs a concurrent memory operation through a second port of said memory array during each test memory operation, and wherein said concurrent memory operations occur at a fixed number of addresses away from the test memory operations.

32. The multiport memory device of claim 31, wherein the test memory operations access said memory cells consecutively via said first address register and the consecutive memory operations access said memory cells via said second address register, wherein said control logic maintains said second address register at least two addresses consecutively behind said first address register.

33. The multiport memory device of claim 32, wherein the test and concurrent memory operations comprise read operations.

34. The multiport memory device of claim 33, wherein the concurrent memory operations occur through a plurality of said ports in parallel.

35. The multiport memory device of claim 32, wherein the test and concurrent memory operations comprise write operations.

36. The multiport memory device of claim 35, wherein said built in self test circuit performs a read operation after each pair of test and concurrent operations.

37. The multiport memory device of claim 36, wherein each read operation occurs at a memory address that is between the addresses of the test operation and the concurrent operation.

38. The multiport memory device of claim 31, wherein each of the test memory operations comprises a first read operation followed by a write operation.

39. The multiport memory device of claim 38, wherein each of the concurrent memory operations comprises a second read operation executed during the first read operation and a third read operation executed during the write operation.

40. The multiport memory device of claim 39, wherein the second read operation occurs two addresses behind the first read operation, and wherein the second read operation occurs two addresses ahead of the write operation.

41. The multiport memory device of claim 40, wherein the second and third read operations are performed through a plurality of said ports in parallel.

* * * * *